US010460069B1

(12) United States Patent
Burdick et al.

(10) Patent No.: US 10,460,069 B1
(45) Date of Patent: Oct. 29, 2019

(54) FUNCTIONAL REACTIVE PCELLS

(71) Applicants: Cadence Design Systems, Inc., San Jose, CA (US); Robert Bosch GmbH, Stuttgart (DE)

(72) Inventors: Thomas Burdick, San Jose, CA (US); Peter Herth, San Jose, CA (US); Göran Jerke, Stuttgart (DE); Christel Bürzele, Stuttgart (DE); Daniel Marolt, Stuttgart (DE); Vinko Marolt, Stuttgart (DE)

(73) Assignees: Cadence Design Systems, Inc., San Jose, CA (US); Robert Bosch GmbH, Stuttgart (DE)

( * ) Notice: Subject to any disclaimer, the term of this patent is extended or adjusted under 35 U.S.C. 154(b) by 857 days.

(21) Appl. No.: 14/984,844

(22) Filed: Dec. 30, 2015

(51) Int. Cl.
*G06F 17/50* (2006.01)
(52) U.S. Cl.
CPC .................. *G06F 17/5081* (2013.01)
(58) Field of Classification Search
CPC .................................................. G06F 17/5081
USPC ........................................................ 716/136
See application file for complete search history.

(56) References Cited

U.S. PATENT DOCUMENTS

| 7,698,662 B1* | 4/2010 | Wu ...................... G06F 17/5068 716/104 |
| 2009/0007031 A1* | 1/2009 | Ginetti ................ G06F 17/5045 716/136 |
| 2013/0298092 A1* | 11/2013 | Ting ....................... G06F 19/00 716/102 |

* cited by examiner

*Primary Examiner* — Jack Chiang
*Assistant Examiner* — Brandon Bowers
(74) *Attorney, Agent, or Firm* — Schwegman Lundberg & Woessner, P.A.

(57) ABSTRACT

Electronic design automation systems and methods for functional reactive parameterized cells (FR-PCells) are described. In one embodiment, a PCell includes a reactive parameter that is based on context information regarding other cells or elements of an overall circuit design. Processing of the FR-PCell may then depend on processing of other PCells or other elements of a circuit design. Similarly, an FR-PCell may provide context information to other FR-PCells. In some embodiments, processing of an FR-PCell to generate an instance of the FR-PCell is managed by a reaction engine that monitors updates to context information or other PCells to automatically adjust instances of the FR-PCells.

20 Claims, 13 Drawing Sheets

FUNCTIONAL REACTIVE PCELLS

TECHNICAL FIELD

Embodiments described herein relate to electronic design automation (EDA), and to systems, methods, devices, and instructions for functional reactive parameterized cells used for the design of electronic devices.

BACKGROUND

Electronic design automation (EDA) is a category of systems for assisting with the design of electronic systems and devices. Such electronic design automation systems work in a design flow that allows system designers to create and analyze complex systems. Tools for device design, simulation, analysis, and verification are part of many electronic design automation systems.

A parameterized cell (PCell) refers to an EDA tool, which is a representation of a part or a component of a circuit whose structure is dependent on one or more parameters. A cell in a circuit design is a basic unit of functionality, and a PCell allows flexible representation of a cell by allowing different parameters. A PCell with selected parameter values may be used as part of a circuit design. An instance of a PCell with selected parameter values allows creation of the structure for the associated component within a larger circuit design. The PCell thus simplifies the design process by standardizing certain portions of a circuit and using input values to generate shapes of a mask design for the portion of the circuit associated with the PCell. Classic PCells are limited to receiving input values for the parameters and generating the associated portion of a circuit layout. Such PCells are purely functional, with the same set of input parameter values generating the same corresponding design layout regardless of any other elements of an overall circuit. Statically-Context-Enhanced PCells (SCE-PCells) represent a specific subset of Classic-PCells whose PCell instances receive immutable information about their surrounding design context via instance specific and context-specific parameters.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
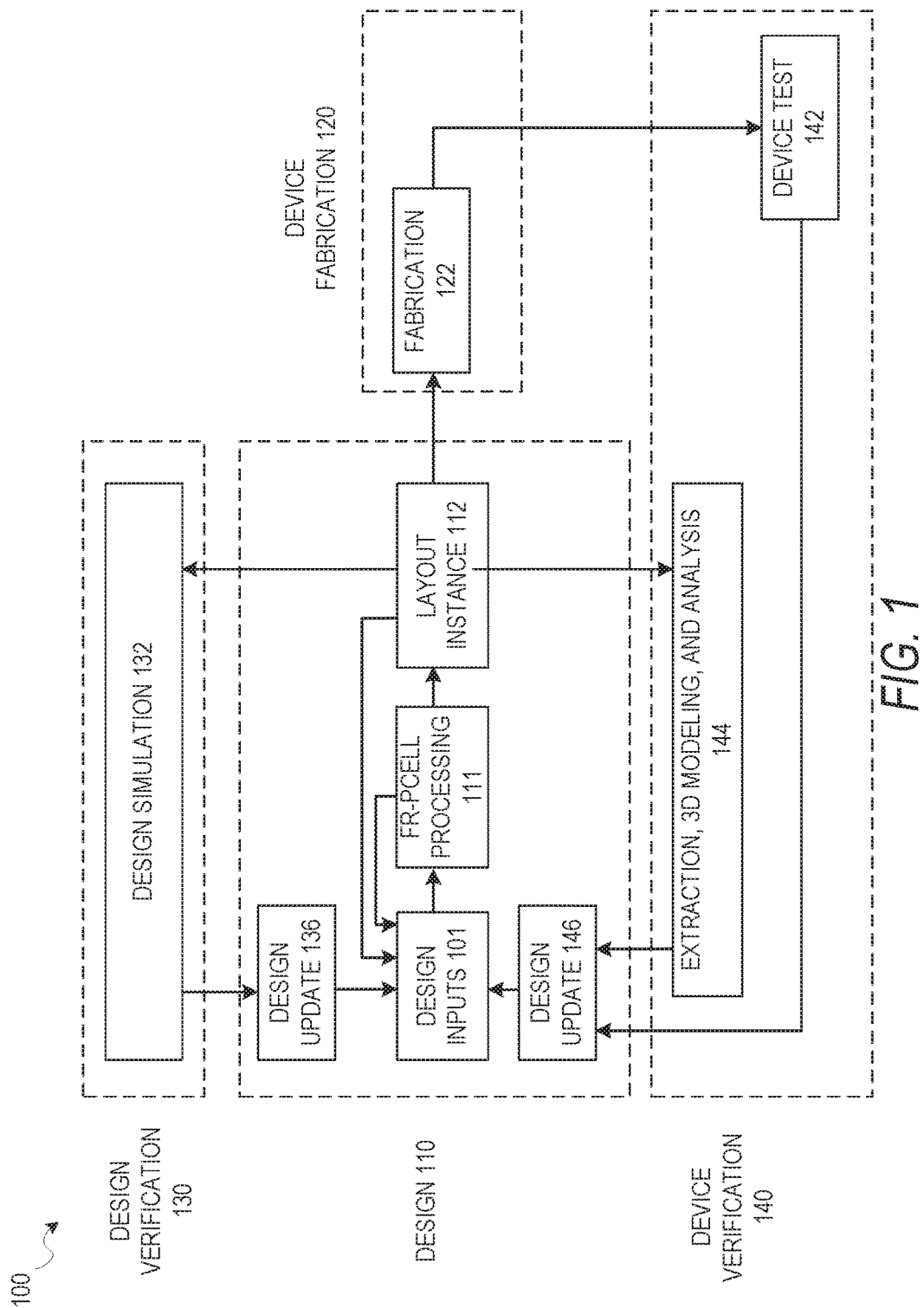
FIG. 1 is a diagram illustrating one possible design process flow for generating a circuit using functional reactive PCells (FR-PCells) according to some example embodiments.

Example embodiments described herein relate to methods, computer media, and devices generating instances of functional reactive parameterized cells (FR-PCells) as part of a circuit design. While certain example embodiments are discussed, particularly with respect to circuit layout, it will be apparent that others, including those associated with front-end circuit design as well as layout, are attainable within the scope of the innovations presented herein.

A PCell super-master refers to the instructions that make up a PCell in the absence of assigned values for the PCell parameters. A PCell sub-master is a representation of a circuit cell based on a set of values for the parameters of a particular PCell. An instance of a PCell is a representation of the use of a circuit cell, based on a set of values, in a particular design context. A circuit design may include multiple instances of a particular PCell, different instances using different parameters for a single PCell, or different PCells, in addition to other circuit elements that are not instances of a PCell. The design context defines the surrounding design framework in which all design objects, PCell instances, and non-PCell instances are imbedded.

Classic PCells are a simple mechanism for introducing user-customized automation into a circuit design. They allow automation of parts of the layout process by drawing parts of a device based on a set of parameters passed to them by the layout designer. Classic PCells present a simple functional model to the user: a PCell is a function which accepts a set of parameters and produces a sub-master containing the corresponding geometry. Such classical PCell instances can be evaluated in any arbitrary order, as many or as few times as desired, producing the same result, freeing the system and the user from questions of side-effect and order of evaluation.

Embodiments presented here allow PCells not only to automate selected cells in isolation, but also to access the design context their instances are placed in, allow self-reflection and self-references of PCell instances, communicate with one another directly and indirectly, provide add-on functionality as tool services, provide functionality to store arbitrary data, provide functionality to lend or inject its own functionality to/into other PCells and scripts, accept other PCells or PCell instances as parameter input, produce PCells or PCell instances, execute script code before and after evaluation, and modify their instance environments including the behavior of other PCells during their evaluation. This is accomplished by extending the functional model of PCells. While such access to context information adds complexity to a system, an FR-PCell system of reactive functions retains the basic functional automation of a cell within a circuit design. While some of the presented PCell innovations can be realized without a functional reactive system or methodology, all of them benefit from such a system which enables their full capabilities.

FR-PCells as described herein thus include a number of benefits not previously known. FR-PCells are aware of their context, unlike Classic-PCells. Classic-PCells are created without context awareness by design. Absence of context awareness makes the Classic-PCell interface and usage simple as an abstraction. This simplicity also prevents Classic-PCells from drawing themselves correctly under certain design conditions. Classic-PCell instances are thus unable to manage rules with regards to nearby metal layers, guard ring cuts, interconnect selection, and other such context elements. While PCells with reactive parameters add complexity, this complexity enables these PCells to automatically manage such context elements.

Similarly, FR-PCells are able to automatically respond to any design information including design constraints. Because Classic PCells do not include relevant information either as a property or as a parameter, they are not able to access or set a PCell instance based on this information and leave such tasks to be performed manually by a layout user. Any additional context information, including routing information, design constraints, via creation, or automated cell design information, is also not accessible to a classical PCell. Using a reactive parameter as described by various embodiments herein, a PCell is able to automatically integrate this information into an instance as part of a circuit design.

Additionally, while some Classic PCells may be statically context-enhanced (e.g. SCE-PCells) to analyze the context of an instance at a single point in time, such PCells do not include reactive parameters which may receive or output context information within an FR-PCell analysis environment. Instead, such PCells receive a manual trigger to set a one-time context input. Because such PCells do not operate within a context framework, they suffer from issues of maintainability and complexity, add potential breakage points, and risk conflicting with other PCells or sources of context in a design. FR-PCells avoid these issues by operating in a standardized managed environment which is, among others, structured for complex interactions between PCells. While the present discussion refers to PCells and FR-PCells, a PCell, discussed herein as including a reactive parameter, refers to an FR-PCell.

FIG. 1 is a diagram illustrating one possible design process flow for generating a circuit using functional reactive PCells (FR-PCells) according to some example embodiments. It will be apparent that other design flow operations may use FR-PCells, but design flow 100 is described here for the purposes of illustration. As illustrated, the overall design flow 100 includes a design phase 110, a device fabrication phase 120, a design verification phase 130, and a device verification phase 140. The design phase 110 involves an initial design input operation 101 where the basic elements and functionality of a device are determined. This design input operation 101 is where PCells are used in the design and any additional circuitry is selected, and where static values for PCell parameters are initially selected by a designer. The initial strategy, tactics, and context for the device to be created are also generated in the design input operation 101, depending on the particular design algorithm to be used. Following an initial selection of design values in design input operation 101, FR-PCell processing occurs in operation 111, along with any other automated design processes. As described below, the processor-based evaluation of FR-PCells may occur in a variety of different ways depending on the particular structure of the FR-PCells. In some embodiments, a live reaction engine (LRE) may be used to manage the evaluation of multiple PCells with reactive parameters. In other embodiments, other systems or other PCells to manage context inputs and changes to an FR-PCell instance may be used. An unsuccessful FR-PCell processing operation 111 may result in an unstable design, where reactive parameters create loops in the design that never resolve, or where design constraints are unable to be met. Such an instance may generate an error or notice to return to design input operation 101. When FR-PCell processing operation 111 resolves to a set layout, a layout instance 112 results. The layout describes the physical layout dimensions of the device that match the design inputs. This layout may then be used in a fabrication operation 122 to generate a device, or additional testing and design updates may be performed using designer inputs or automated updates based on the design simulation 132 operations or 3D modeling and analysis 144 operations. Once the device is generated, the device can be tested as part of device test 142 operations, and layout modifications generated based on actual device performance.

As described in more detail below, design updates 136 from design simulation 132, design updates 146 from device test 142 or 3D modeling and analysis 144, or direct design input operation 101 may occur after an initial layout instance 112 is generated. In some implementations, the FR-PCell processing operation 111 may automatically identify changes to context elements of reactive parameters that create changes in PCell instances. This automatic identification may occur based on a LRE, manual triggers or any other automatic device operation used for observing database values associated with reactive parameters that are updated. FR-PCell processing operation 111 may then generate new PCell instances using the updated context values or reactive parameter values to generate a new layout instance 112 for the device containing new instances of any PCells having values adjusted by design updates 136, 146 or design input operation 101.

In some embodiments, in the design input operation 101, functional reactive PCells are placed like any other conventional PCell. The layout user in an EDA design framework generating the design input operation 101 can configure parameters. The layout a user will observe in such a design framework illustrates via a display or machine interface that FR-PCell instances can react to existing layout elements or context information, react to changes in their environment, modify the environment around themselves, other PCells or PCell instances, or any or all of the above. For example, in various embodiments a user may provide an input to an EDA computing device indicating placement of an FR-PCell instance within a first portion of a layout, a user may provide an input adjusting context elements that impact reactive parameters within a nearby or otherwise related FR-PCell, or a user may adjust a value of an FR-PCell that impacts reactive parameters of the FR-PCell. Each of these user inputs may trigger an evaluation of one or more instances of an FR-PCell within a layout. When such an evaluation is trigger, a graphical user interface (GUI) or any other interface may be updated with an indication that changes are made beyond simple updates to a PCell. In some embodiments, a GUI may provide a list of changes to an FR-PCell and any context element changes generated by the FR-PCell. In other embodiments, a visual indication within a layout may be provided indicating any updates. A user may thus identify the operation of an FR-PCell based on the changes to a layout that are caused by reactive parameters of an FR-PCell, as described in further detail below.

As mentioned above, beyond direct updates of their reactive parameters, functional reactive PCells illustrated in such a design framework can potentially reevaluate any time something which they are observing in the environment is changed. These changes can be layout changes: either the layout presented in a design framework is modified or another PCell changed the shapes it renders as part of a design input operation 101. In various implementations, design inputs may be output values that a PCell was observing, or messages sent by another instance, as described in more detail below. Design inputs might also be EDA constraints, changes to the logical connectivity, or other non-layout changes to the database.

Some reactive instances may be less obvious to the end user: instances that step out of themselves to use various features of a design framework operating on a machine (e.g., EDA processes for smart vias, routers, etcetera, in addition to processes for FR-PCell evaluation) may be similar to FR-PCell evaluation processes. Data from all such processes may be integrated to provide values for reactive parameters of a PCell as described herein.

Additionally, a user can influence the automatic updating behavior FR-PCell processing operations in an EDA design framework via the Live Reaction Engine (LRE). The LRE is a runtime component of the FR-PCell processing system that controls the flow of data between FR-PCell instances and their environment, as well as interactions with any other elements of a design framework or context information of a device design. LRE is described in more detail below with respect to FIG. 5

Figure 2:
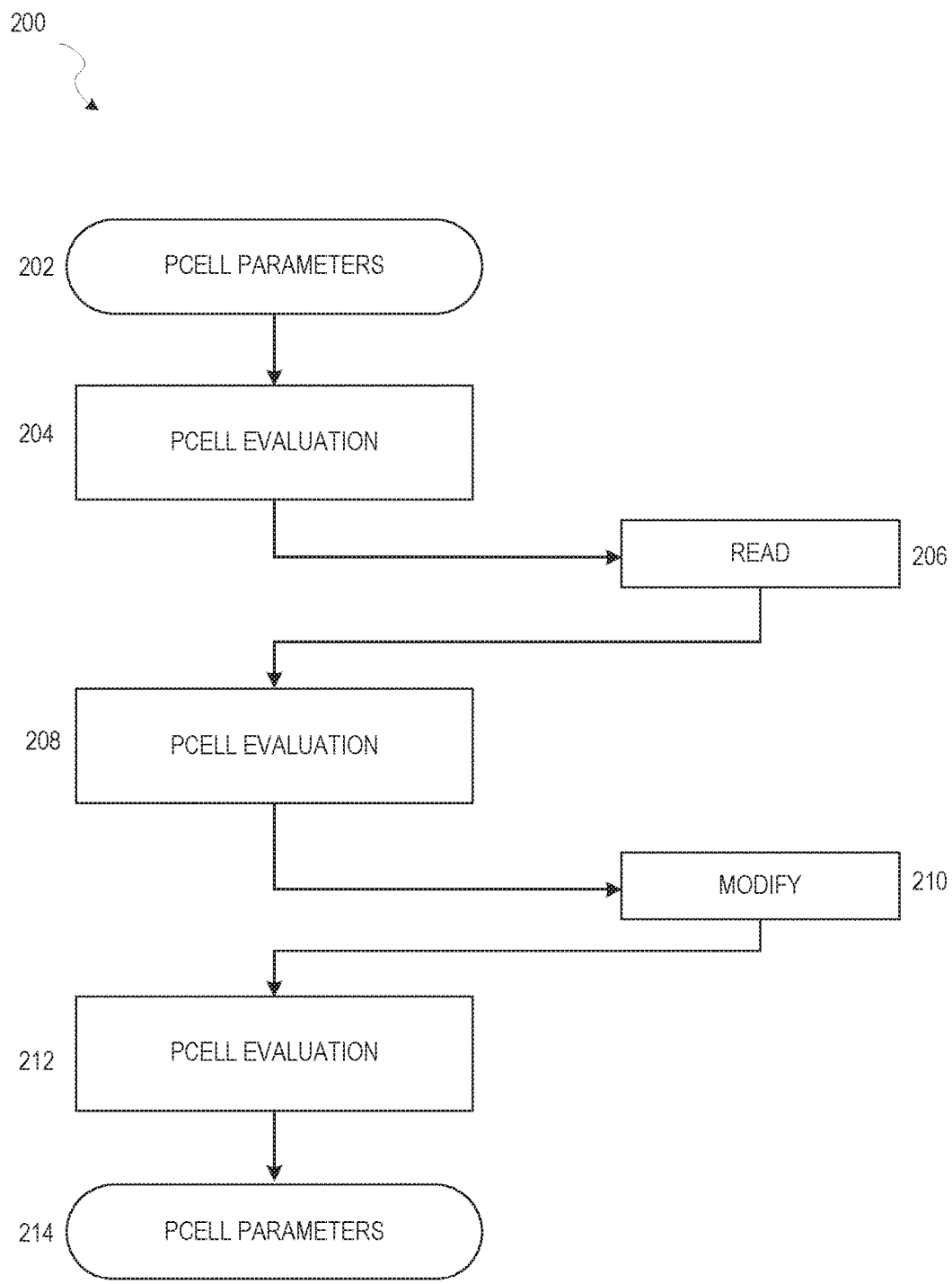
FIG. 2 is a diagram illustrating aspects of an FR-PCell according to some example embodiments

FIG. 2 is a diagram illustrating aspects of an FR-PCell according to some example embodiments. While FIG. 1 describes one example of a design flow for a device, FIG. 2 illustrates an evaluation process 200 for generating an instance of a single FR-PCell. Evaluation process 200 may be part of the FR-PCell processing operation 111, or may be part of a design processing operation of another different design flow in different embodiments.

As mentioned above, a PCell, in certain embodiments, is a set of instructions describing a generic circuit cell, with a set of PCell parameters that are used by the set of instructions to generate a specific PCell instance. Such a specific PCell instance may be a layout of the circuit cell instance. FIG. 2 may then be considered a perspective on one type of FR-PCell evaluation, referred to herein as "pause and look around." In operation 202, initial PCell parameters are accessed, and an initial portion of the PCell is evaluated in operation 204. At some point during or just after the evaluation of operation 204, the evaluation process 200 identifies a reactive parameter that needs a value and pauses evaluation of the PCell. This value may come from any source of context information, including from other FR-PCells. If the value of the reactive parameter is available, the value is read in operation 206 and the evaluation process 200 returns to evaluate a second portion of the PCell in operation 208. If the value is not available after operation 204, then the evaluation of the PCell waits for the reactive value to become available. This may be managed by an overall system that identifies an order for PCell dependencies, and determines how to serially evaluate different portions of PCells in a design. In some embodiments, a system may identify that a value for a reactive parameter is never resolved, and may flag an error in the design. In a functioning PCell, a value will be generated and identified from context information, and read in operation 206.

During or following operation 208, which evaluates a second portion of the PCell, the system may determine that the evaluation of operation 208 has generated context information that is needed by another PCell. The system may then again pause evaluation of the PCell for modify operation 210. Such an operation provides information to other FR-PCells, so that output context information from one FR-PCell is used as a value or to generate a value for a reactive parameter of another FR-PCell. The pause during modify operation 210 may continue while other PCells are evaluated, or other design processes occur, and then in operation 212, a final portion of the PCell is evaluated. When the evaluation process 200 for the PCell is complete, an instance of the PCell is generated as result 214. This instance of the PCell may be integrated with a device layout as part of a design flow, such as an integration as part of layout instance 112 of design flow 100. Steps equal to or similar to 204-208 and 208-212 may occur several times during PCell evaluation. Such steps may be repeated in a variety of orders, with multiple read or modify operations occurring in various patterns.

FIG. 2 shows an example of how a PCell author identifies elements of an FR-PCell. FR-PCell evaluation proceeds normally until an "await reactive value" or a similar command in the FR-PC ell is executed. The body of such a command may be just like any other body of commands, except that it can see itself as an instance waiting for the reactive value. Once execution reaches the end of the "await reactive value" body, evaluation continues inside the PCell, as normal. In the example discussed above, the PCell evaluation operations 204, 208, and 212 may result in a drawing of a routing for the PCell instance, check for conflicts with nearby device elements such as conflicting metal layers. Any conflicts are received as context information and used for reactive values, and then used to repair the routing if needed. A result with any routing repairs based on reactive parameter values are then included in result 214.

The embodiment above illustrates an example with a single pause for read operation 206 and a single pause for modify operation 210. In other embodiments, PCells may pause to look around as often as they like. They are not limited to merely observing their surroundings, either. A metallization PCell, for example, might want to find the transistor it overlaps, align them correctly, draw its metallization, and cut a passage for its routing through guard rings. Many different embodiments may operate using the framework of partial PCell evaluation, followed by read and/or modify operations, repeated until a result is achieved.

Figure 3A:
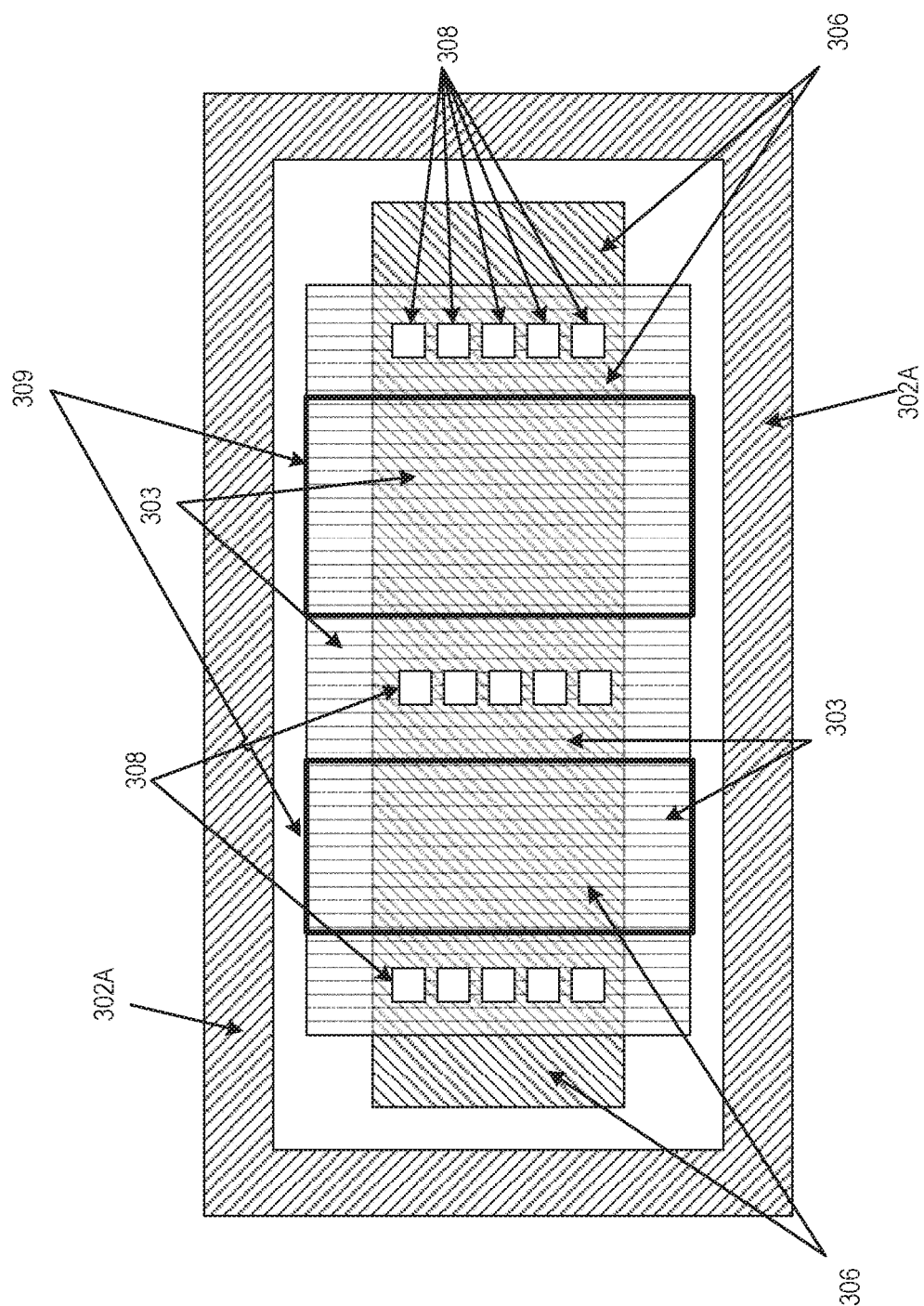
FIG. 3A illustrates aspects of an evaluation process showing an embodiment of a cell layout as it is modified through a PCell evaluation process to arrive at an FR-PCell instance based on context information.
Figure 3B:
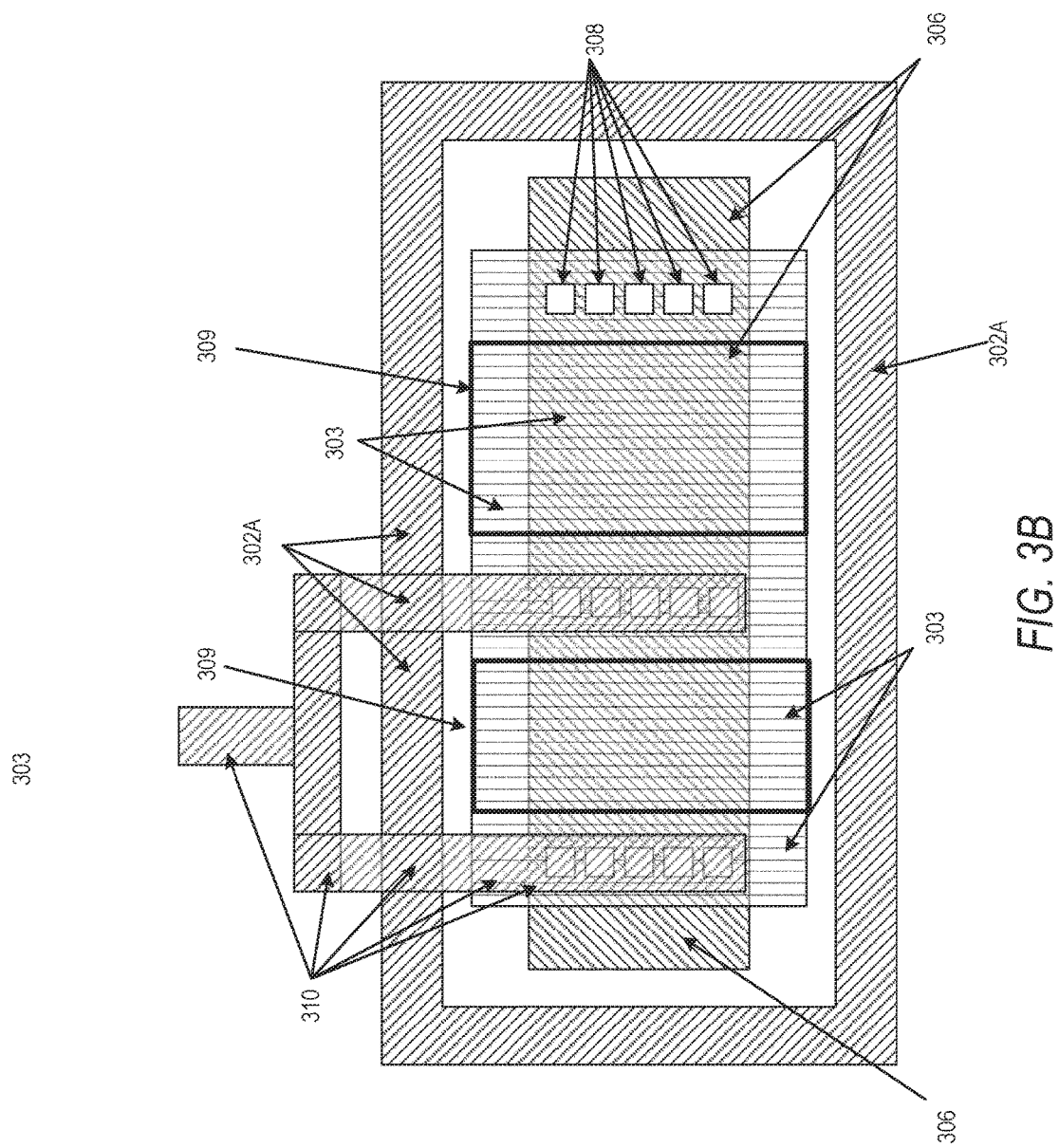
FIG. 3B illustrates aspects of an evaluation process showing an embodiment of a cell layout as it is modified through a PCell evaluation process to arrive at an FR-PCell instance based on context information.
Figure 3C:
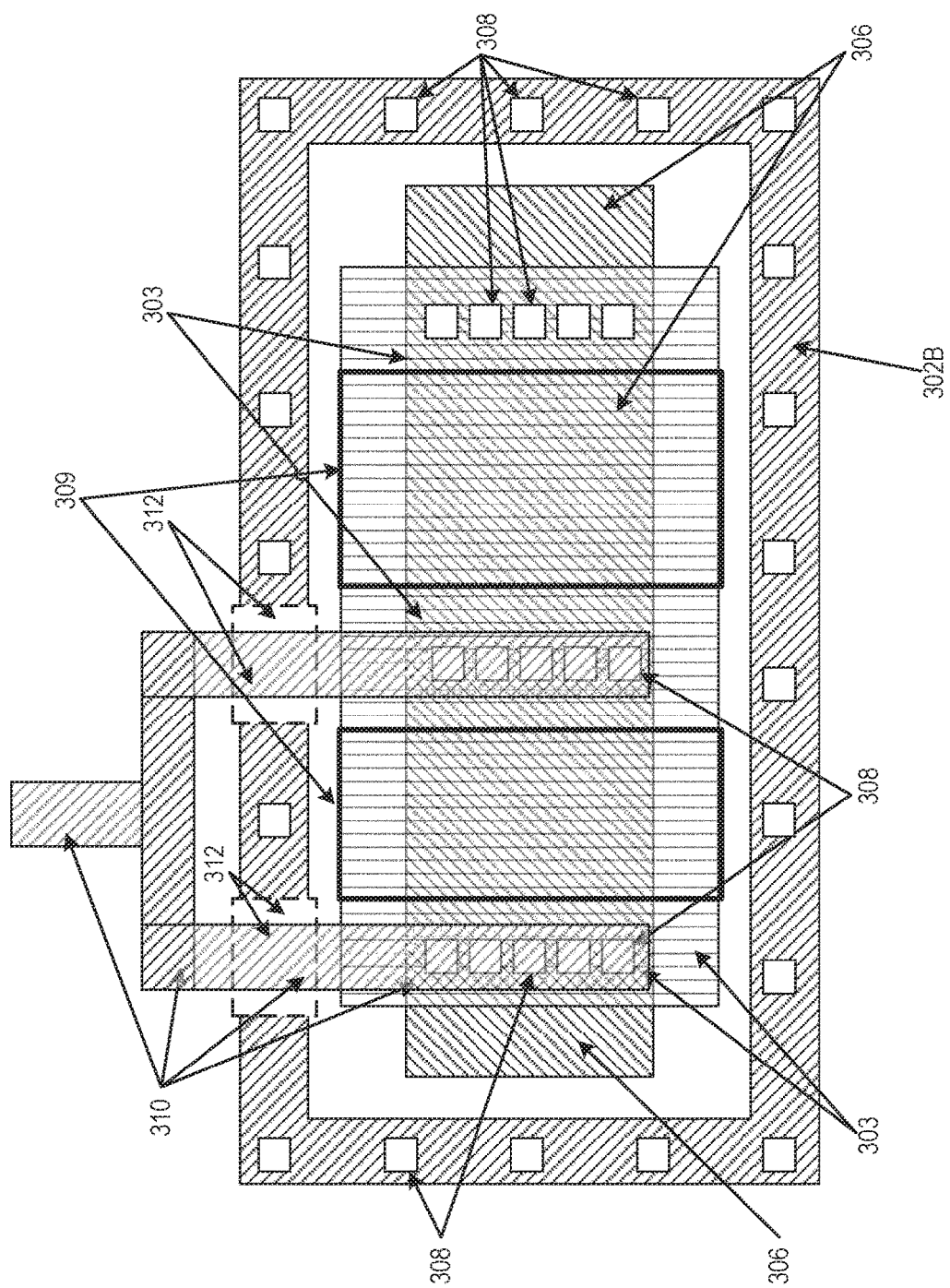
FIG. 3C illustrates aspects of an evaluation process showing an embodiment of a cell layout as it is modified through a PCell evaluation process to arrive at an FR-PCell instance based on context information.

FIGS. 3A-C illustrate an evaluation process showing an embodiment of a cell layout as it is modified through a PCell evaluation process to arrive at an FR-PCell instance based on context information.

FIG. 3A illustrates an example PCell instance generated after a partial evaluation of an FR-PCell describing a transistor including first transistor layer 303, second transistor layer 306, transistor gates 309, and vias 308 surrounded by guard ring 302A. For simplicity, the transistor gates 309 are illustrated as simple shapes in FIGS. 3A-C. Guard ring 302A includes portions in both the same device layers as first transistor layer 303 and second transistor layer 306. At this point in the evaluation of the example PCell of FIG. 3A, the PCell evaluation pauses and checks for context information outside of the PCell instance.

As illustrated in FIG. 3B, metal routing 310 is identified and read as a value for a reactive parameter along with routing rules that the guard ring 302A should not short with the metal routing 310. After reading this information and obtaining values for the reactive parameter, the PCell evaluation resumes and modifies the guard ring 302A to avoid shorting metal routing 310, resulting in guard ring 302B. FIG. 3C includes guard ring 302B shown including the metal cut areas 312 as well as connections between the two layers of the guard ring 302B, which are added in the uncut portions of guard ring 302B in the final part of the illustrated evaluation of the PCell. The transistor layout of FIG. 3C is then included as an instance of the PCell in the device layout along with metal routing 310 and any other layout cells that are part of the overall device. Modifications to any parameter values of the PCell illustrated in FIG. 3C, as part of design changes from a designer input, or based on device testing or modeling, may then result in the evaluation of the PCell being re-run to generate a new instance of the PCell using the new parameter values. Thus, even if values for the PCell are not changed directly, a routing change to metal routing 310 may be received as a value for a reactive parameter of the PCell and used to generate a new PCell instance with a different cell layout.

In one embodiment, the following may represent a PCell associated with FIGS. 3A-C:
PCELL FUNCTION
accepting parameters length, fw, fingers, rw
to create submaster
=
Create Instance NM1 with length, fw, fingers
Create Group "Ring" containing
Ring shape "ring" of width rw on Metal1
Ring shape following "ring" on Nimp
Ring shape following "ring" on Oxide
Await value of "avoid"
Set "avoid" to all Metal1 shapes
   Connected to the terminals
   Of the instance "inst"
Chop "ring" to avoid "avoid"
Use a shape as a parameter "cont"
Create a contact shape
Fill with "cont"
The intersection of
   The Metal1 in group "Ring"
   The Oxide in group "Ring"
Processor evaluation of this PCell may break into three functions:
PCELL PART 1
accepting parameters length, fw, fingers, rw
to create incomplete submaster
=
Create Instance NM1 with length, fw, fingers
Create Group "Ring" containing
Ring shape "ring" of width rw on Metal1
Ring shape following "ring" on Nimp
Ring shape following "ring" on Oxide
REACTION FUNCTION
accepting inst "inst"
creating value for "avoid"
=
Set "avoid" to all Metal1 shapes
Connected to the terminals
   Of the instance "inst"
PCELL PART 2
accepting incomplete submaster
accepting avoid
to create complete submaster
=
Chop "ring" to avoid "avoid"
Use a shape as a parameter "cont"
Create a contact shape
Fill with "cont"
The intersection of
   The Metal1 in group "Ring"
   The Oxide in group "Ring"
To draw an instance of the PCell, the three functions are chained together:
REACTIVE PCELL FUNCTION
accepting length, fw, fingers, rw
to create submaster
PCELL PART 1
Draw instance using produced submaster
REACTION FUNCTION
Add incomplete submaster
PCELL PART 2
When the environment of the PCell instance has changed in such a way that any of the things that the reaction function has observed (e.g., the shapes connected to the terminals of "inst") changes, the functions are re-chained. For example:
Recover the incomplete submaster
REACTION FUNCTION
If "avoid" has not changed
STOP
Otherwise add incomplete submaster
PCELL PART 2
This FR-PCell may be used in a non-interactive environment if the reactive parameter is reduced to a classical value, to generate a classical PCell such as:
CLASSICAL PCELL FUNCTION
accepting length, fw, fingers, rw
to create submaster
=
PCELL PART 1
Add saved value of "avoid"
PCELL PART 2
In some embodiments, each pause during evaluation of a PCell may result in a state of the PCell or any PCell in the system being saved. When such a system arrives at the result PCell instance of FIG. 3C, intermediate instances for FIGS. 3A and 3B may be saved, with the instance associated with FIG. 3A saved after a pause to read context information, and the instance associated with FIG. 3B saved after a pause before modification of the PCell instance based on the context information of metal routing 310. In the example design flow 100, during a design flow loop after the first layout instance 112 is generated, second design inputs may then be received. The second evaluation of FR-PCell processing 111 may then start from a different saved state depending on the new design inputs. If PCell parameters from operation 202 change, for example with a basic change to the dimensions of transistor layers 303 or 306, then the entire PCell would be evaluated from the beginning.

If, however, no change occurs to any PCell parameters in operation 202, but changes occur to metal routing 310, then the intermediate PCell instance saved at the state shown in FIG. 3B may be restored, and processing of the PCell may begin at this state. While a simple example illustrated by FIGS. 3A-C may not save significant processing time with such a state restore, for complex designs including many FR-PCells or many reactive parameters, resuming from such an intermediate PCell instance may save significant processing resources.

Figure 4:
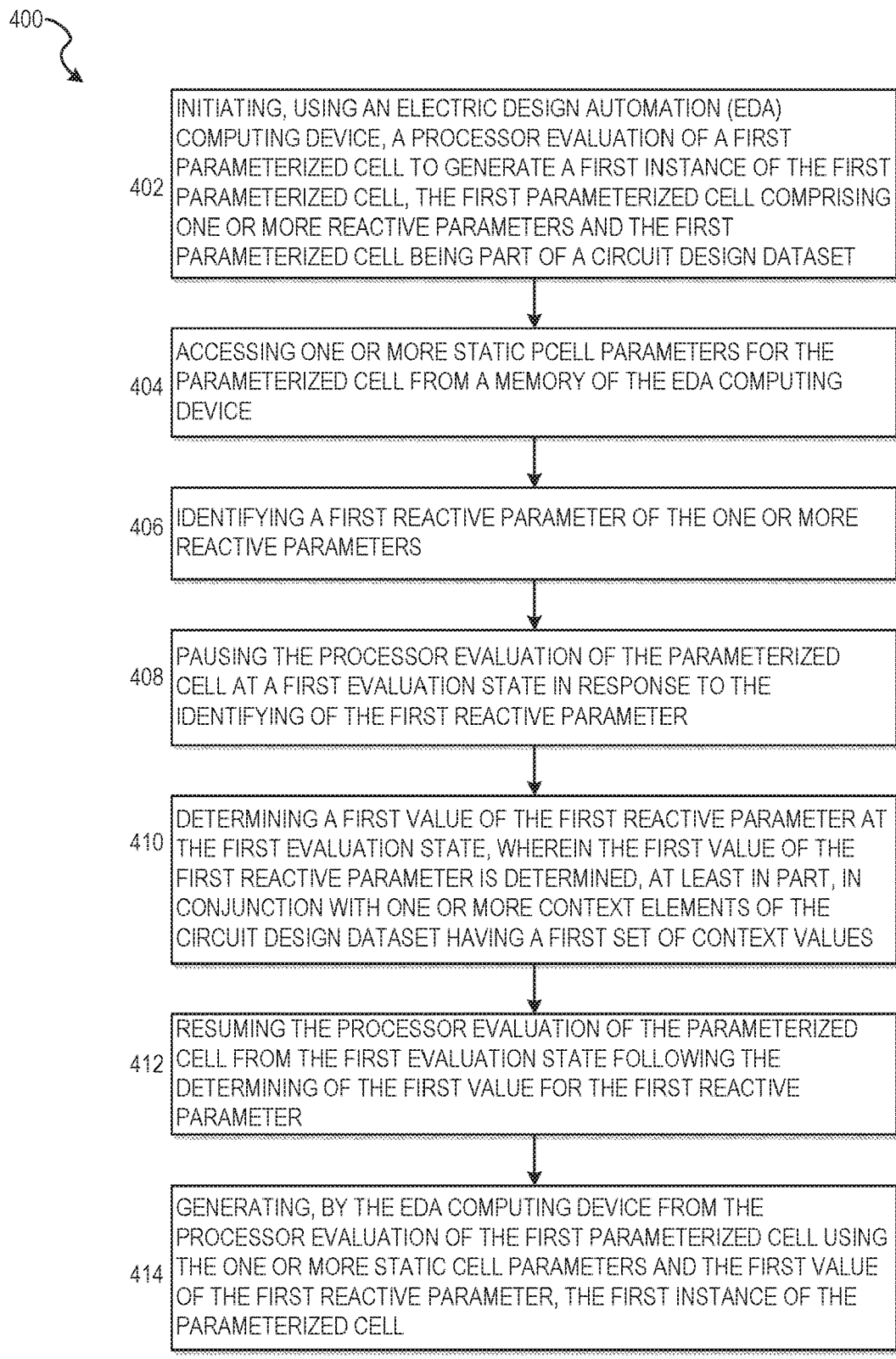
FIG. 4 describes a method of evaluating a PCell to generate an instance of the PCell.

FIG. 4 describes a method of evaluating a PCell to generate an instance of the PCell. Such a method 400 may be performed by an electric design automation computing device, which may be a machine 1000 of FIG. 10 executing an architecture 902 of FIG. 9. In other embodiments, other machines may be configured with hardware, software, and/or firmware to implement method 400 or any other such method described herein for PCells including reactive parameters.

As part of method 400, a processor evaluation of a first parameterized cell is initiated to generate a first instance of the first parameterized cell as part of operation 402. This initiation for evaluation of the first PCell may occur in different ways. The first PCell may begin evaluation based on a call from another PCell that uses context information from the first PCell. The first PCell may begin evaluation as an initial first portion of a device to be evaluated with a layout instance. The first PCell may begin evaluation following a change in a value for a parameter of the first PCell. In any such case, the first parameterized cell is structured with one or more reactive parameters as circuit design dataset for a device.

The evaluation proceeds by accessing one or more static PCell parameters for the parameterized cell from a memory or disk of the EDA computing device in operation 404. Such parameters may include any static design values for a PCell set by a design input or update. Examples of such parameters include dimensions of geometry in a device layer, numbers of fingers in a device element or cell, or any other such values that describe elements of a cell.

Evaluation of the FR-PCell will, at some point, involve identifying a first reactive parameter of the one or more reactive parameters in operation 406, and pausing the processor evaluation in operation 408. Such a pause may be managed as part of a single-threaded evaluation for a device as it evaluates portions of the PCell and determines that additional information is needed or that information has been generated that is needed for another PCell or another portion of the circuit design. In other embodiments, an LRE managing generation of a device layout including the PCell or other management systems may identify the reactive parameters and pause evaluation of the PCell.

As described above for operations 206 and 210 of FIG. 2, at some point during system operation following a pause, a value for the reactive parameter associated with a pause will be determined. This occurs in operation 410, which involves determining a first value of the first reactive parameter, wherein the first value of the first reactive parameter is determined, at least in part, in conjunction with one or more context elements of the circuit design dataset having a first set of context values. The value for the reactive parameter may be a value generated by the evaluation of the first PCell to be used by other parts of a circuit. The value of the reactive parameter may be generated by an evaluation of a second PCell. The value may also be generated by other context elements such as routing, vias, or other elements not necessarily associated with a second FR-PCell.

After the determining of the first value for the first reactive parameter, the processor evaluation of the first PCell is resumed in operation 412 from the state that existed at the time of the pause. The evaluation of the first PCell then proceeds until an instance of the first PCell is generated. This instance of the first PCell is generated in operation 414 using the one or more static cell parameters and the first value of the first reactive parameter, the first instance of the parameterized cell.

While a single pause and resume is described herein, any number of operations for different reactive parameters may be part of the generation of an instance for a single PCell. Additionally, as described below, a dataset for a circuit design may use instances of multiple PCells, or multiple instances of a single PCell, as part of a layout for a device.

Figure 5:
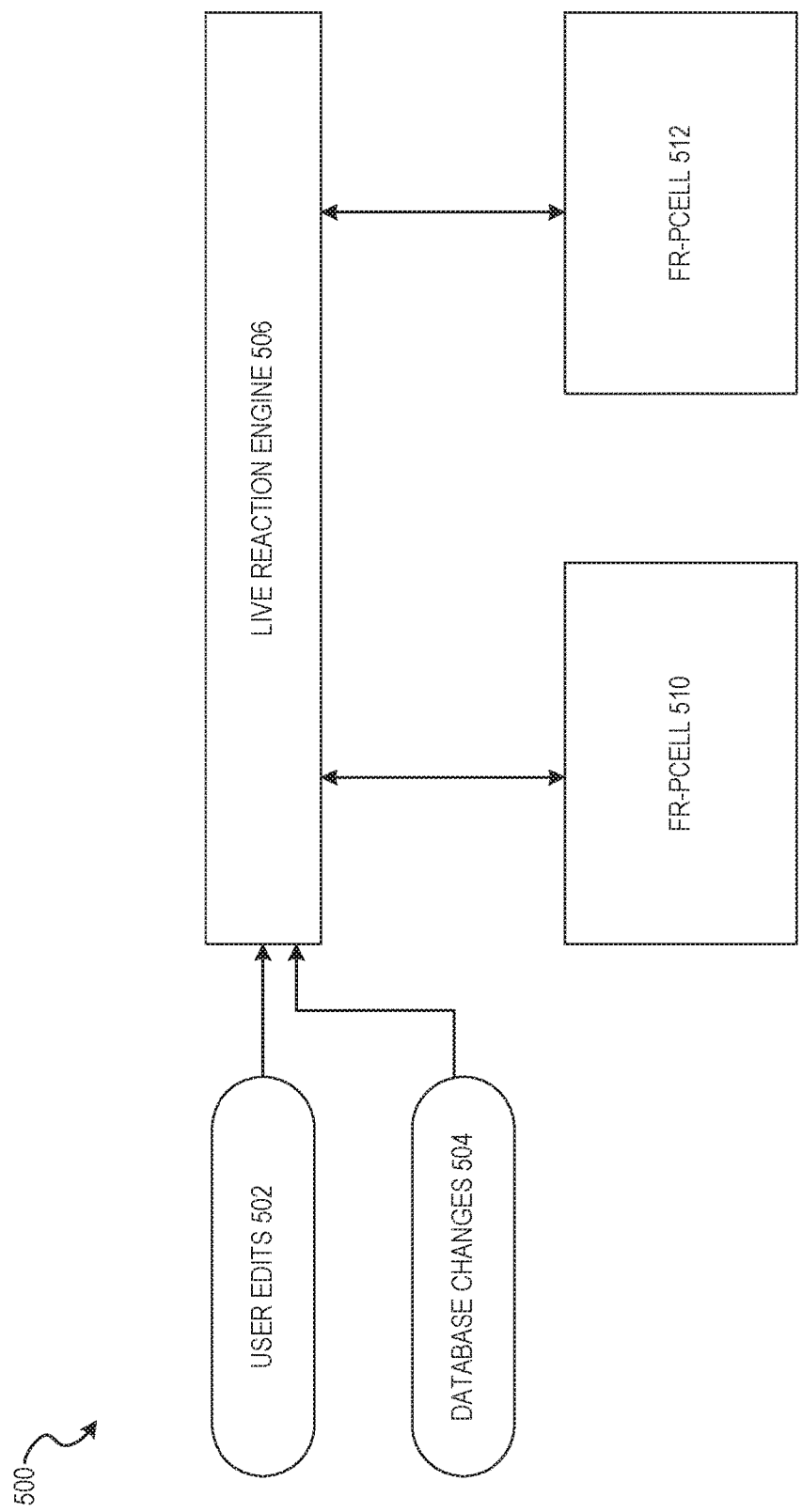
FIG. 5 illustrates aspects of a system for processing FR-PCells using a live reaction engine (LRE) according to some example embodiments.

FIG. 5 illustrates aspects of a system for processing FR-PCells using a live reaction engine (LRE) according to some example embodiments. FIG. 5 illustrates system 500 including the use of a live reaction engine (LRE) 506 to manage evaluation of PCells 510, 512. An LRE operates as a driver and controller from the extended PCell capabilities of an FR-PCell described herein. In various embodiments, an LRE may operate as an application 910, a service 922, or any combination of application 910, library 906, or operating system 904 element in a software architecture 902. In other embodiments, other implementations of an LRE 506 may be used. The LRE 506 operates to observe events occurring in an EDA tool of a machine operating as part of a design flow, such as user edits 502 or database changes 504. Events such as user edits 502 to a circuit design dataset, automatic design updates based on verification analysis or simulation, or any other changes that impact a device design occurring on a machine or within a EDA design system may be observed by an LRE 506. The events observed by an LRE 506 may be propagated to any PCell 510, 512 for a circuit design dataset under evaluation by a system including the LRE 506. In various embodiments, LRE 506 may manage context information reactive parameter values communicated to and from PCell 510 and PCell 512, as well as any information communicated to other elements of an EDA design framework operating on a machine or network with LRE 506. While system 500 shows two PCells 510, 512, any number of PCells may be managed by LRE 506. Additionally, design inputs for a circuit design dataset may include placement of multiple cells using a single PCell, with some instances of a single PCell sharing identical parameters or different parameters. Further, design inputs may include different PCells with different cell components, geometry, or circuit structure. All of these may be managed by LRE 506, and may be part of an FR-PCell processing operation such as FR-PCell processing operation 111 for a device design operating in an EDA environment of one or more machines. The design context 500 may be provided by the EDA design framework as view context or by any PCell having access to the current local design context. In various embodiments, the LRE is not limited to managing an evaluation of FR-PCELL instances, but may also modify parameters of classic and SCE-PCell instances or any other design object, and may trigger reevaluation of any of these.

During evaluation of a PCell 510, 512 having a reactive parameter to generate a PCell instance, the PCell 510, 512 function (e.g., the set of instructions that make up the PCell 510, 512 or the method of the PCell 510, 512 and any component methods of the PCell 510, 512) are broken into multiple functions. Each function is set up to see the appropriate environment (e.g., the associated PCell sub-master or intermediate instance). The evaluation of each function (e.g., each element or portion of the PCell) is chained to cause parameter values and control between PCell instances to flow as needed by the LRE 506. In some embodiments, each component function, or a pause between the flow of different component functions, both for individual PCells and between different PCells, is a potential point for backtracking when depended-upon values have changed. When LRE 506 determines that recalculation is needed, it picks-up evaluation at the appropriate place associated with a function that was broken from a PCell 510, 512.

In some embodiments, different models may be used for FR-PCell operation within an LRE such as LRE 506. The pause and look around model is used above for the initial description. Other embodiments may use an agent model, a formula model, or any type of governor model. In some implementations, the use of different models for PCell management may impact the evaluation of the PCell, while in others, the models simply result in slightly different conceptual considerations for a PCell, with the functional evaluation and generation of PCell instances occurring in a similar or identical way for a given cell instance as part of a device design. In some embodiments, an EDA design framework will simply decompose a PCell into a series of monadic operations on a database, with LRE 506 operating to manage a discrete-valued progression of changing parameter values. In other embodiments, LRE 506 operates as a manager of ordered mailboxes, which decomposed PCell functions (e.g., partial elements of a PCell) use to order their evaluation and communications with one another based on depended-upon values generated by different decomposed PCell functions.

In the pause and look around model described above, PCell evaluation proceeds linearly in a top-to-bottom fashion. Whereas a classical PCell would begin and end evaluation of a single PCell in an uninterrupted fashion, an FR-PCell is evaluated in separate elements separated by pauses to manage reactive parameters. LRE 506 processing an FR-PCell in this model operates to evaluate a portion of a PCell such as PCell 510, pause evaluation to jump outside PCell 510 for evaluation of some or all of another PCell such as PCell 512 or some other context information (e.g., routing or vias), and then return to PCell 510 to continue. PCell 510 may be divided into any number of parts, with jumps away from evaluation of PCell 510 between parts. This model thus operates as a stepwise serial evaluation of portions of a device, with a resulting layout instance including particular instances of PCell 510 and PCell 512. Updates to the parameters of PCells 510 and/or 512 result in reevaluation using the same stepwise serial evaluation. As described above, in some embodiments, pauses between PCell elements may be saved, such that the reevaluation may begin from an intermediate state rather than an entire reevaluation of all elements of a design.

Figure 6:
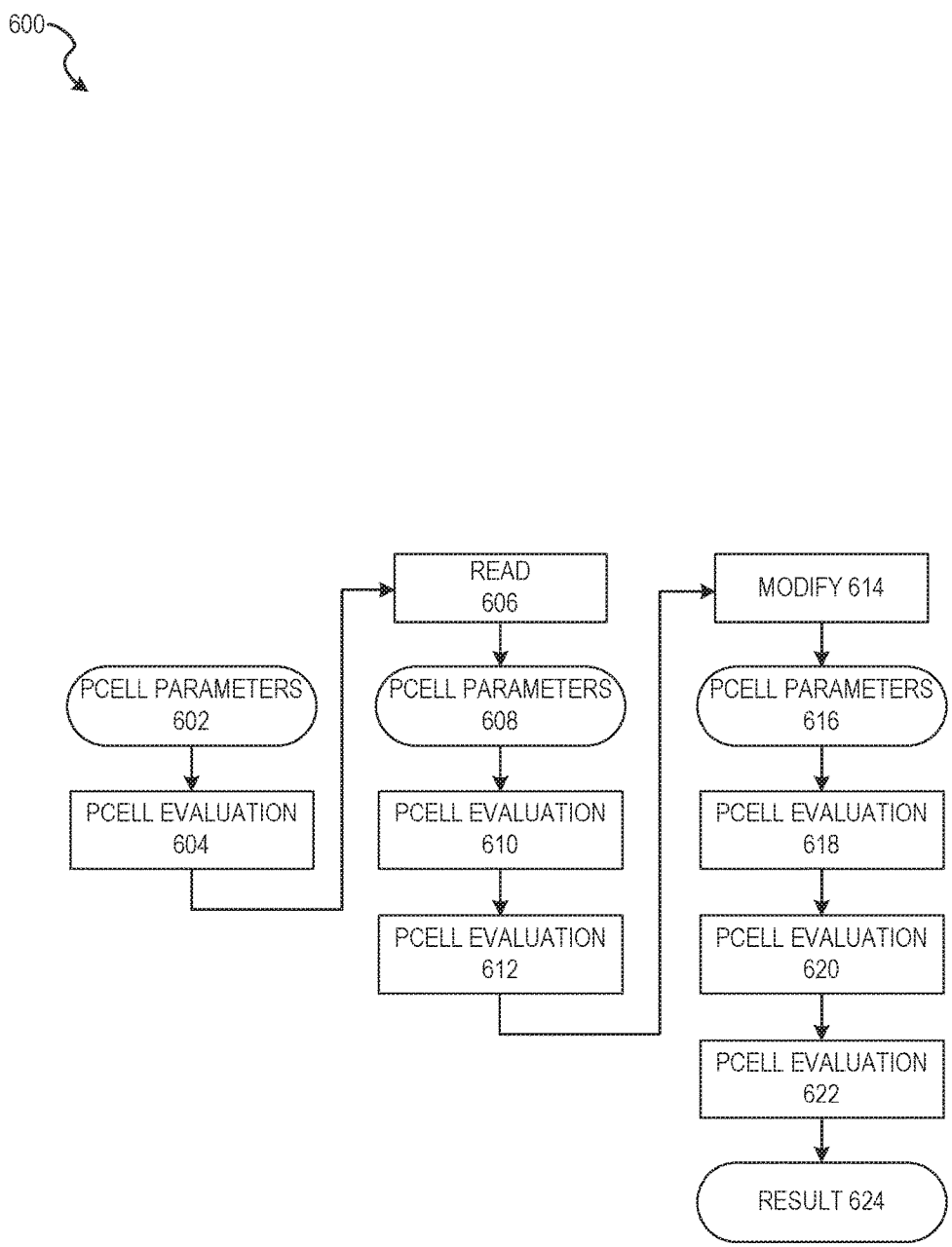
FIG. 6 illustrates aspects of a system for stepwise processing of multiple FR-PCells in a system according to some example embodiments.

FIG. 6 illustrates aspects of a system for stepwise processing of multiple FR-PCells in a system according to some example embodiments. FIG. 6 illustrates a simple implementation of a PCell evaluation 600 to emulate stepwise evaluation of the pause and look around model of evaluation for any number of instances of a PCell in a design. This begins with static PCell parameters in operation 602. The PCell evaluated in PCell evaluation 600 is processed in six functional elements during operations 604, 610, 612, 618, 620, and 622. Each pause in PCell evaluation 600 between these elements may be associated with a corresponding value. This may be a marker that the pause has not been reached. If an element is associated with the initial marker value, the LRE managing PCell evaluation 600 is informed that the given sub-master (e.g., intermediate PCell instance) is pausing itself at the indicated point, the sub-master is marked with a warning marker, and PCell evaluation stops (e.g., in response to read 606 and PCell parameters 608 or modify 614 and PCell parameters 616, to be resumed after the pause while another PCell is evaluated); otherwise, evaluation continues.

When the LRE has been informed that a sub-master is pausing itself, the LRE queues a reaction for later. Once the paused PCell evaluation 600 has finished, the LRE finds all instances of the paused sub-master. The appropriate reaction function is evaluated on each paused instance, and its results queued for continuing the PCell evaluation 600. To resume PCell evaluation 600, the paused instances are updated with the value computed by the reaction function (e.g., PCell parameters 608 or 616), and the paused sub-master is purged. The updated instances will share a new sub-master if their reaction function computed the same value; otherwise they will diverge. PCell evaluation 600 begins again at the beginning, proceeding past the pause-point, on to the next pause or the end of the PCell. An instance can be made to re-react by resetting a reactive value (and all subsequent reactive values) to the pause-marker.

Figure 7:
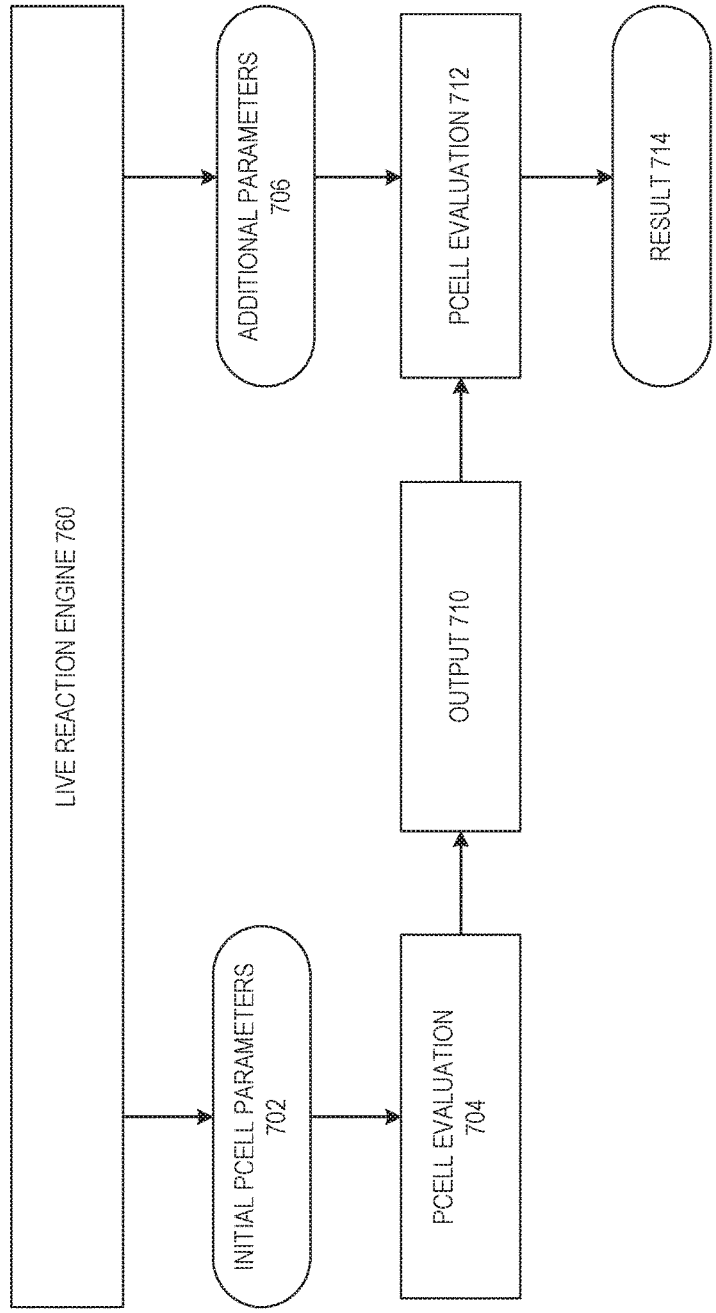
FIG. 7 illustrates aspects of a system for processing FR-PCells using a LRE according to some example embodiments.

FIG. 7 describes an embodiment of a pause and look around model of PCell evaluation according to some example embodiments. FIG. 7 describes a pause and look around model of PCell evaluation 700. In PCell evaluation 700, if the LRE 760 is present and operating after initial PCell parameters 702 are used for PCell evaluation 704, the FR-PCell evaluation 704 function informs the LRE 760 that it was evaluated, and immediately stops evaluation. Outside of the PCell evaluation context, the LRE 760 chains together evaluation of the component functions making up the FR-PCell. Some of the component functions are related to a PCell sub-master, some pointed at instance environments. An extra PCell parameter is needed by the LRE 760 to track state and to control PCell evaluation in such an embodiment. Instance sub-master (e.g., intermediate instance) matching continues to be branched as needed for different instances of the same PCell, under complete control of the LRE 760. An instance of a PCell may thus be generated in a manner that is managed more flexibly by LRE 760, with initial PCell parameters 702 used for evaluation of a first portion of a PCell instance in PCell evaluation 704. A pause may then occur for any additional parameters 706 or output values 710, as managed by LRE 760. PCell evaluation 712 of other elements of the PCell is then conducted to generate a PCell instance as result 714. Other instances of the same PCell with different additional parameters 706 based on placement within an overall design may result in different layouts for different resulting instances of the same FR-PCell.

Returning now to FIG. 5, an alternative model for operation of an LRE such as LRE 506 is an agent model. An agent model describes a system where a layout instance is resolved or set using collaborative work of independent agents, which work in cooperation towards the layout instance for the circuit design. In this model, PCells such as PCells 510, 512 are structured as agents. Each of the PCell agents runs their own code, and they can send messages, including context information or values for reactive parameters, to themselves, to particular nearby instances, or broadcast messages for all adjacent, contained, or containing instances of a design under evaluation by LRE 506. This is a variation of the "send and forget" style of agents. Such actor models are related to and may be implemented using agent models similar to those available for the Actor model originally explored by SIMULA, MDL (Massachusetts Institute of Technology Design Language), and Smalltalk.

In some embodiments, the LRE 506 operates as a transport and control layer for communications between PCells such as PCell 510 and PCell 512. LRE 506 provides the messaging infrastructure for the communication itself, and controls the propagation of the messages. In such embodiments, this ensures an efficient reaction to any message or information communicated between PCells. Some embodiments of an LRE 506 may additionally evaluate communicates between PCells to verify that only communications involving depended-upon values of a reactive parameter are communicated in order to avoid unnecessary PCell evaluations.

In some embodiments, the LRE 506 provides a means for the user or a higher-level design algorithm to control the reactive behavior of the individual PCells 510, 512 or groups of arbitrarily-typed PCells. Such an embodiment of LRE 506 includes a mechanism for detecting simple loops and oscillations, and will provide the end user with the ability to stop and restart reactive events. Other embodiments may use automated detection to identify such loops and oscillations. For example, a system may track stored states for each reactive parameter or each PCell. If the number of stored states exceeds a threshold value, if a given enabling condition is met, or if the parameter values between intermediate instances of a device, circuit, or PCell do not vary by more than a threshold amount, the system may automatically terminate evaluation with a flag identifying the threshold and other related parameter values. In the simplest case this will apply to an entire cell view, but sets of instances for multiple PCells, particular PCells, or all aspects of a device design may be stopped depending on the observed behavior of the EDA environment managed by the LRE 506.

In some embodiments, the LRE 506 uses existing event-stream mechanisms. Certain systems may use database observers, Interprocess Communication, or other such observation systems. In some embodiments, if a depended-upon value or enabling condition for a reactive parameter is not available via an existing stream mechanism identified by LRE 506, or if time itself is the observed value, LRE 506 may use a timer to generate events to trigger the depended-upon value.

The above embodiments of PCells with reactive parameters may then be used to implement a variety of different automation species as part of EDA systems. For example, the stepwise evaluation model is enabled by a functional decomposition of the PCell function, which the LRE recombines appropriately. Flowing from this are a number of capabilities including context access, direct and dynamic context awareness, dynamic context alteration, functional composition of PCells, instance self-awareness, dynamic PCell modification, PCell communication as well as direct and indirect PCell interaction.

The design context of an FR-PCell instance or any other Classic- and SCE-PCell instance can be fully accessed before the start of its PCell evaluation, during the PCell evaluation pause, and after PCell evaluation has finished. This enables an PCell instance to become self-aware. The PCell sub-master can access the context of its instances with read and write/modify operations. The former enables dynamic context awareness; the latter introduces the ability to dynamically alter the context of a PCell instance, or the PCell instance itself (e.g., recursive PCells,) during context access.

The direct read access to the context enables its unrestricted scan by FR-PCell instances. This scan then uses the ordinary means offered by the PCell-API of the design framework and the design framework itself to gather and post-process relevant context information and to store results in regular FR-PCell internal variables.

The direct write access to the context enables an FR-PCell sub-master (e.g., an intermediate PCell instance) to actively alter its context or to create another modified version of itself. The restrictions of what can be altered are set by the design framework of a particular EDA environment.

The functional decomposition of the PCell function to facilitate stepwise evaluation of FR-PCells introduces the possibility of passing in additional functional components from the outside; effectively, this allows one to inject additional PCell behavior at PCell instance evaluation time. While behavioral injection introduces additional challenges for PCell verification, it can lead to more versatile context-aware PCell templates and to simpler PCell migrations to other technologies.

The combination of stepwise evaluation and the ability to access the context of an instance opens the possibility of PCells that manage self-changes and recursive aspects (e.g., "self-aware" aspects.) FR-PCell instances may reference, trace and scan themselves before, during and after PCell evaluation. Context access after PCell evaluation (e.g., immediately after PCell evaluation has finished) enables several self-centered actions of FR-PCell instances, including self-flattening FR-PCell instances, self-modifying FR-PCell instances, self-deleting FR-PCell instances and recursive PCells (e.g., FR-PCell instances can invoke several recursive PCell evaluations of themselves).

The agent model allows multiple FR-PCell instances to explicitly link themselves together in a network. They can then collaborate on a shared, predefined design goal. The formula model allows information in the FR-PCell instance's context to be accessed, and leaves it up to the system to infer dependencies based upon access queries. This enables ad-hoc interaction based on the results of general queries. Such instances can assemble themselves into an implicit network.

Further still, the availability of the above-described facilities make various complementing PCell concepts possible. In particular, these complementing PCell concepts include PCells operating as tool functionality users or tool functionality providers; design observers, governors, planners and collaborators; PCell taking other PCells and PCell instances as inputs (i.e., "high-order PCells") and PCells producing other PCells and PCell instances as output (i.e., "PCell factories"); data collectors and storages etcetera.

Classic-PCells and SCE-PCells are limited to local calculations that can be performed during stream-out and during PCell evaluation. This effectively prevents them from using tool functionality and services provided by the EDA design environment (e.g., simulators, parasitic extractors, module generators, routers or verificators/validators) or other FR-PCells. Tool Users are FR-PCells which pause their execution to use one of these tools on themselves. The result of this tool use is pulled back into the PCell.

A Tool Service can be considered as a "tool" that is used to accomplish a specific design task during PCell evaluation. A Tool Service defines a unique function to achieve a distinct design task, either within the PCell sub-master or within the design context. The application of this concept within FR-PCells calls for an abstraction and standardization of tool functionality.

In addition to using framework-provided tools, FR-PCells can also use or provide arbitrary functional tool services back to the EDA design framework or to Tool Users. These Tool Providers need not limit themselves to stream-safe code, as their purpose is to be a controlled source of tools during interactive use. These Tool Provider PCells can also be used as smart and interactive tools within an EDA design environment.

A Planner PCell (i.e., "high-level PCell") interests itself in advancing towards a specific design goal. To this end, it coordinates other FR-PCells, ordinary instances, and Tool Providers, which may be tools that come from the framework or from Tool Provider PCells. The utilized tool functionality allows the Planner PCell to delegate low-level design tasks to suitable lower-level tools. The Planner PCell can thus concern itself only with its chosen task, leaving the details to the chosen tools.

The wrapping and delegation of tool functionality can be done in a hierarchical manner, whereby each new layer creates a corresponding higher-level of abstraction. Planner PCells can thus be used to create abstract design algorithm and module templates, which represent important building blocks for the next evolution step of PCell module design.

A "higher-order PCell" is one that, in addition to classic parameters, also takes PCells or PCell instances as inputs. These PCells passed in as arguments could be of any sort: Classic-PCell, SCE-PCell, or FR-PCell. In particular, the consideration of PCells as input can also occur dynamically during PCell evaluation.

Several subtypes of high-order PCell are possible, including embodiments with a high-order PCell instance that either statically or dynamically receives or requests additional functionality and/or modification code from other PCells and PCell instance objects. In other embodiments, a high-order PCell instance dynamically injects new functionality into other PCells and PCell instances, lends own functionality for other PCells and PCell instances, or modifies existing functionality of PCells and PCell instances. In still further embodiments, a high-order PCell instance statically or dynamically wraps one or more other PCell instances in-place without modifying them, thus enhancing/modifying their capabilities. High-order PCells are likely very helpful to build technology-dependent and technology-independent PCell templates and context-aware Tool PCells.

Since FR-PCells are not limited to the production of physical polygonal results, they may automatically produce any design result including new PCells and PCell instances, any type of design object, source code and compiled source code. An additional application example is the automatic generation of PCell code fragments for PCell behavior injection. The created PCells can be of any type and any purpose (i.e., schematic/symbol/layout PCell or Tool-PCells).

Many advanced FR-PCell use cases (e.g., PCell modules and context-driven PCells) that may rely on or benefit from some form of collaboration between FR-PCell instances and their design context to accomplish an individual or a common design goal. A collaboration uses an interaction between FR-PCell instances and their respective context. Interaction is here defined as a sequence of one or more communication-based information exchanges between FR-PCell instances and their context or vice versa. Independent of the information exchange, and in contrast to classic top-down design algorithms, any single communication process inherently causes a self-focused and individual reaction of all involved FR-Pcell instances.

The information exchange is carried out by (1) a self-guided or strategy-driven modification of design object parameters or design objects (e.g., polygons); or (2) by letting FR-PCell instances react to arbitrary context changes; or (3) by letting FR-PCell instances react to changes of their reactive parameters according to their programming regime. The modification of parameters hereby occurs either directly or indirectly. The information exchange may include command data, status data, property data (e.g., geo location or any other object property/design data) etcetera.

A careful orchestration of the information exchange process and the capabilities provided by FR-PCells can be utilized to create sets of collaborating FR-PCell instances: self-organizing sets (bottom-up approach) and strategy-driven sets (top-down approach). The orchestration of these sets is provided by Collaborative Design Algorithms (CoDA) in FIG. 8. CoDA offer mechanisms for the management of a network of interacting PCells to accomplish a common design goal. CoDa may, in certain embodiments, be implemented as part of or in conjunction with design flow 100 of FIG. 1.

Figure 8:
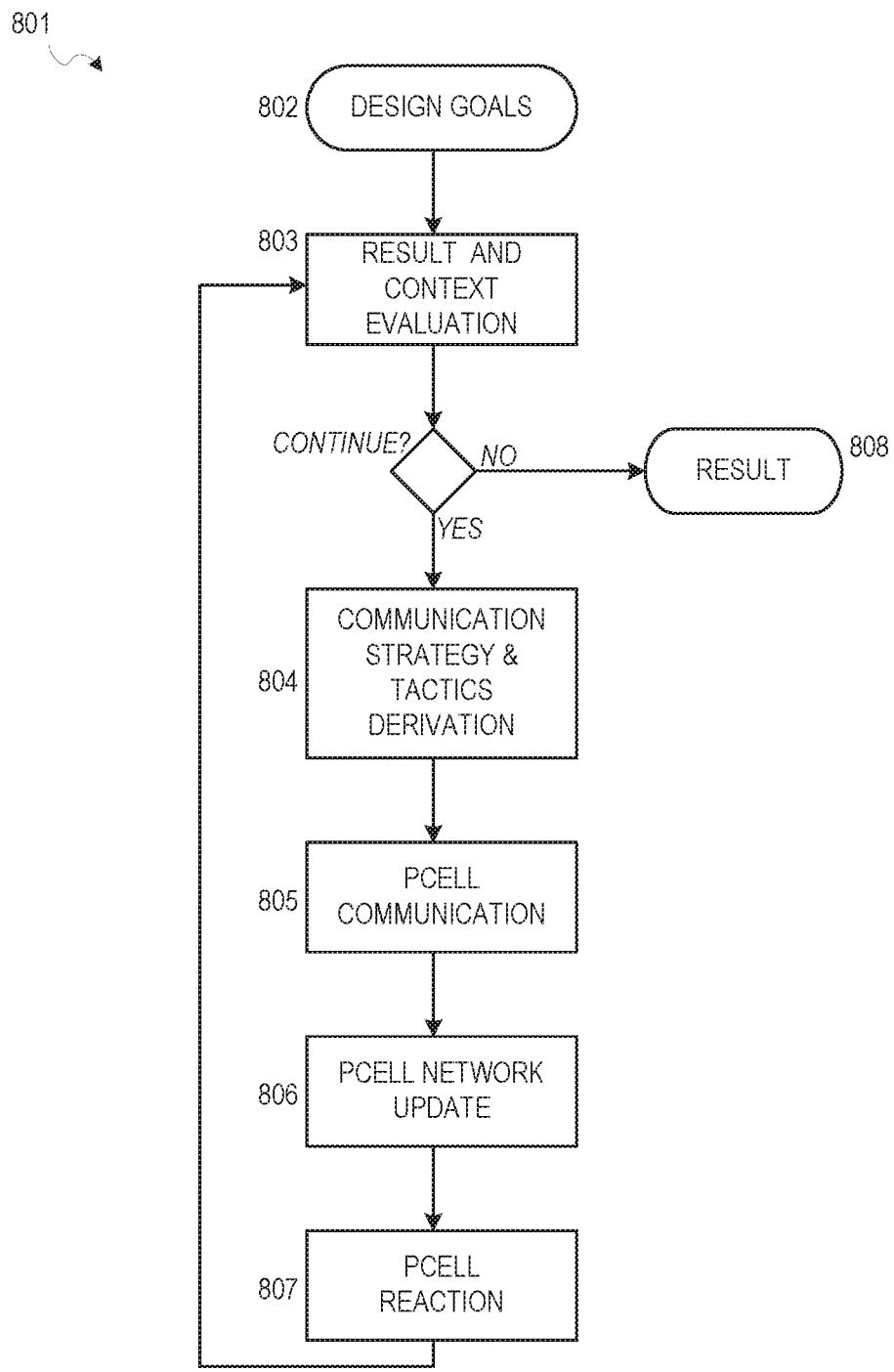
FIG. 8 describes an embodiment of a pause and look around model of PCell evaluation according to some example embodiments.

An example embodiment of a CoDA is described in FIG. 8 where the user has defined a specific design goal 802 that is to be achieved within a design context 801. The design context is first evaluated in step 803. A communication strategy is first developed/devised and a communication tactics subsequently derived by the operations in step 804 to orchestrate the PCell communication in step 805. The communicating PCell network is then updated in step 806 regarding its own state, and regarding the linked PCell parameters and states of the participating PCell instances of the communication network. For example, step 806 may be achieved by the re-calculation of an FR-formula that links parameters of connected PCell instances. Connected PCell instances then react according to communication results and context changes in step 807. The context change and the design result are then re-evaluated again in step 803. The algorithm finishes in case the design goal has been met in step 808. Otherwise, the communication strategy is first refined, new tactics are derived and the loop starts again in step 804. CoDAs can be used to create top-down and bottom-up design algorithms. CoDAs have the potential to evolve into an important building block for the next generation of PCell module designs, advanced node designs and physical design in general.

The PCell concepts described above enable various PCell application use cases. Additionally, several of these new PCell concepts can be combined to create new PCell applications.

In some embodiments, an FR-PCell instance need not have any meaningful output shapes. Context access can be used by FR-PCell instances to scan their context, derive and process context data, report the results (i.e., "observers") or react according to the results (i.e., "watchdogs").

In other embodiments, an FR-PCell instance may be used as data storage object to store and process arbitrary design data, such as design parameters or design state (i.e., data storage container), settings of the EDA design environment (i.e., Context Setup-PCell), messages of other FR-PCell instances (i.e., Proxy-PCells), or even executable code (i.e., Tool-PCell) etcetera. The stored data information can be easily copied to other design contexts and reused there.

In some embodiments, a "Design Violation Observer" PCell instance may report specific design violations, such as missing metal slots in wires, metal density violations, wrong instance orientations, etc. Geometry query functionality can be utilized to retrieve layout violations or to find design patterns. A "Design Statistics Observer" PCell instance may collect design statistics, such as the utilized layout area, the number of occurrences of certain layout patterns, the available metal density budget, etc. The trigger to update the status information will come from the design framework/LRE or manually from the user.

A "Watchdog" FR-PCell instance will wait in the background for certain design events or design situations to occur. If such an event or situation occurs, then a predetermined reaction of the watchdog is triggered. A direct link of the FR-PCell instance/the LRE into the design frameworks' event handling system would be useful to trigger a reaction of watchdog PCell instances. Watchdogs may prompt the designer for extra information in the form of explicit input to the watchdog (e.g., through the use of a graphical pop-up form).

An FR-PCell instance need not have any meaningful output shapes. A context area is placed purely for the side-effects it has on its overlapping and/or adjacent layout. Examples include the use for planning, measurement, floor-planning and routing purposes. In any implementation where a layout designer would manually use a given technique, they can create a Context Region reactive PCell to do it automatically. For example, one embodiment of a Context Region router would be placed as a fluid instance, with a "text" layer polygon allowing the layout user to control the affected region. Such a PCell would implement a particular routing technique (e.g., using an external routing tool). Any shapes or instances which overlap the Context Region are analyzed, and the routing between them is modified appropriately. This would assist with route problems such as power-routing and constraint-compliant connections to complex terminal layouts.

Certain embodiments may involve context-aware FR-PCells, that define PCells whose instances are capable of reacting to context changes while not performing substantive changes to themselves, i.e., changes affecting the substance of the resulting circuit design or physical implementation. The awareness to events or changes may be used in certain embodiments over automatic adjustments due to design safety reasons. Example embodiments may be instance-specific visual notification of instance- or region-specific violations that are caused by context changes. This could include the notification about excessive terminal current flows at instance pins, parasitic properties of an instance, or LDE-related properties (e.g., distance active-deep trench for well proximity effect).

Context-driven FR-PCells define PCells whose instances are capable of reacting to context changes while performing substantive changes to themselves. In addition to context awareness abilities, any context-driven PCell may use methods and capabilities to convert the context information into a final design result. For instance, in some embodiments a constraint-driven PCell instance may be able to adjust the placement of its internal subdevices according to given placement constraints, etc.

As described earlier, FR-PCell instances can be used to create interactive tools or tool functionality. A FR-PCell instance can get access to its context in its pre-placement and its post-placement phase. FR-PCell can thus be constructed to act similar to paintbrush tools in graphics software applications. Some example embodiments are tool PCells that would repair/improve the layout in a local context or place/align layout objects according to a given set of constraints. Since FR-PCell instances are self-aware, they would be able to self-destruct, thus leaving no trace of themselves after their evaluation is finished.

The capability to accept other FR-PCell instances as input parameters also during the PCell evaluation can be used to dynamically inject code into an FR-PCell instance. Such injection could, for instance, be used to parameterize PCell templates by providing technology information, to map technology data within the PCell or to adjust/influence the behavior of FR-PCell instances. In the latter case, FR-PCell instances could directly send their spatially adjacent instances code or information on how to operate in their proximity. Such embodiments could be used for complex layout situations in advanced technology node, MEMS design or high-power semiconductor designs.

Another example is a high-order PCell that dynamically wraps and replaces other FR-PCell instances on-the-fly. For example, instead of the classic approach of instance instantiation, an FR-PCell instance providing the metallization for power-MOS transistors may automatically catch an existing power-transistor instance. The FR-PCell instance then injects the object code of the caught MOS instance into its own code base, and it gathers the parameters values of the caught instance. The FR-PCell instance is then re-evaluated based on its modified code base and parameters. In such an embodiment, the original PCell instance is then replaced with the newly created FR-PCell instance wrapper.

Meta-PCells may also be used in some embodiments. The Meta-PCell concept is based on a higher-level design planning approach, whose design implementation is then handed by orchestrated or pre-defined tasks that are propagated to and executed by lower-level tools. Such tools can be represented by existing functionality of the EDA design framework, external functionality or other FR-PCells acting as Tool PCells, High-Order PCells etc., or even other Meta-PCells. The Meta-PCell concept provides an approach for the abstraction of the design implementation. In some embodiments, Meta-PCells may be used for the creation of design implementation templates or PCell module IPs.

In a specific embodiment, a Module Meta-PCell can be utilized to create PCell IP modules (e.g., parameterizeable design macros, for purposes such as electrostatic discharge (ESD) protection, power-stages, voltage level shifters, analog blocks, and etcetera). Module Meta-PCells represent design algorithms that implement highly versatile PCell modules on a higher level of abstraction than classical PCells. In some embodiments, Module Meta-PCell modules first define the global placement and routing of a module and delegate all low-level tasks, such as detailed placement and routing, to lower-level tool functions. These lower-level tool functions then leverage the full set of capabilities offered by FR-PCells concepts, such as Tool PCells or High-Order PCells.

In some embodiments, reactive instances can find their neighbors and collaborate in a network of cooperating nodes. An example embodiment is an advanced-node transistor that has strong context-sensitive rules about its gate placement. Such a network can efficiently adapt its instances to follow the gate-array rules, with modifications ranging from $\Omega(1)$ to $O(n \log n)$ for a network of n instances, compared to abutment-based gate-placement, which ranges from $\Omega(n)$ to $O(n^2)$.

Figure 9:
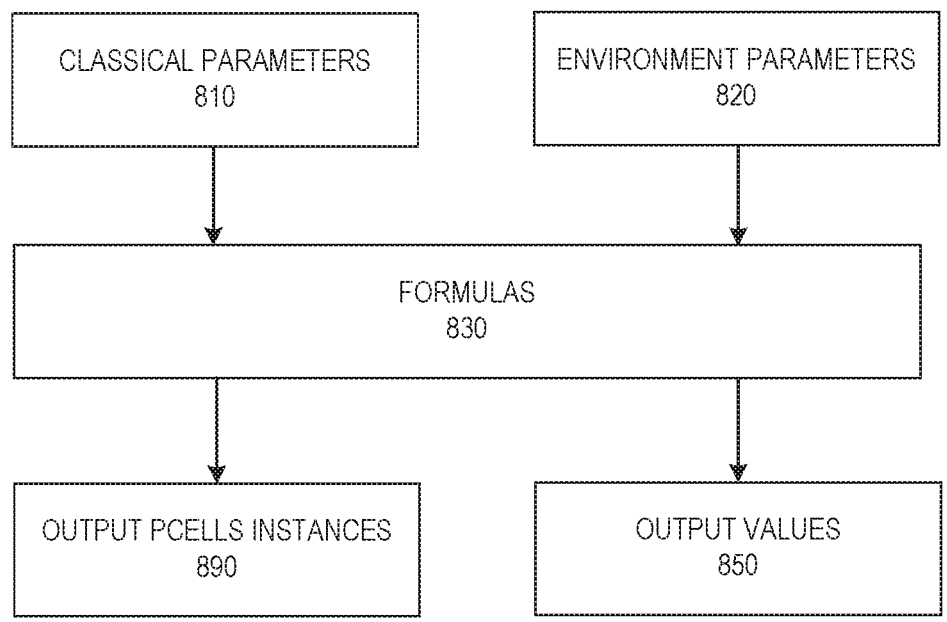
FIG. 9 illustrates aspects of a formula model for FR-PCell evaluation according to certain embodiments.

FIG. 9 then illustrates aspects of a formula model for FR-PCell evaluation according to certain embodiments. In certain embodiments, a formula-based implementation may operate similar to a spreadsheet, with input parameters including classical parameters 910 and static environment parameters 920 similar to input "spreadsheet cells". The PCell may use formulas 930 which track their depended-upon values. This may be through explicitly-named dependencies, or through implicit dependencies, inferred through use. These formulas 930 may be modified by changes in the design around the PCell instance as placed in the overall device design, and changes in the formula 930 may be tracked by an LRE or other aspects of an EDA design framework operating on a machine. Output values 950 may be pushed to other PCells, and output PCell instances 990 may result from use of the formulas.

In some embodiments, which may use any model or method described above, an analysis of one or more PCells may reach a stable state. This may occur automatically as part of FR-PCell evaluation processes, or may be based on user input feedback during evaluation processes. Considering a PCell or a device design as a curried function, all PCell functions are in a fully applied state, and there are no more partially applied functions waiting for a depended-upon value. In such an embodiment, other instances for a fully applied FR-PCell may remain to be evaluated, but with all reactive parameters known by the system or LRE due to processing of previous instances of the PCell or other PCells. In such an embodiment, the remaining instances may be evaluated as Classic PCells using reactive values stored in a database or as part of the previous instances. This treatment may continue until design updates or inputs create unknown values for reactive parameters.

Figure 10:
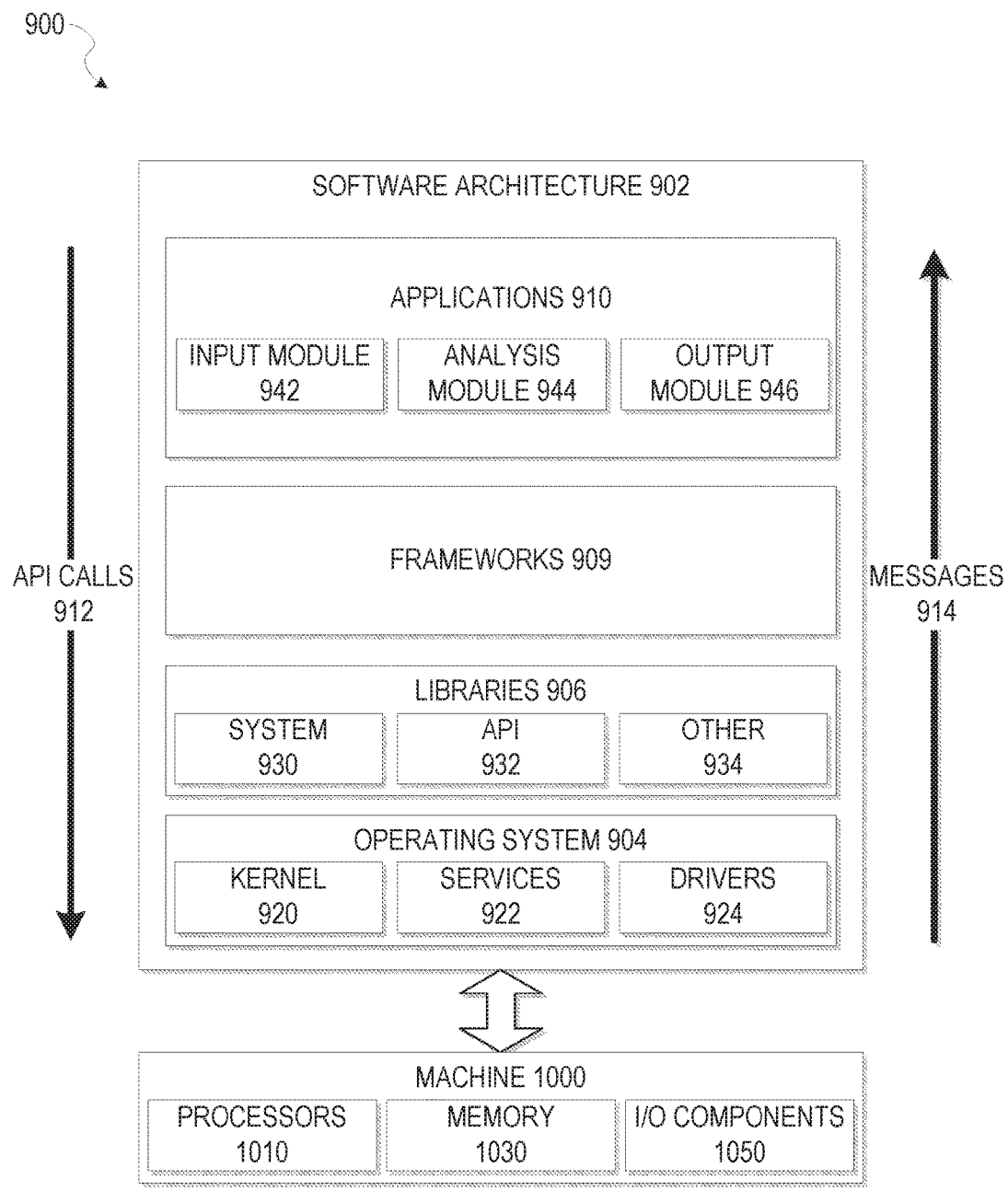
FIG. 10 is a block diagram illustrating an example of a software architecture that may be installed on a machine and used with aspects of functional reactive PCells according to some example embodiments.
Figure 11:
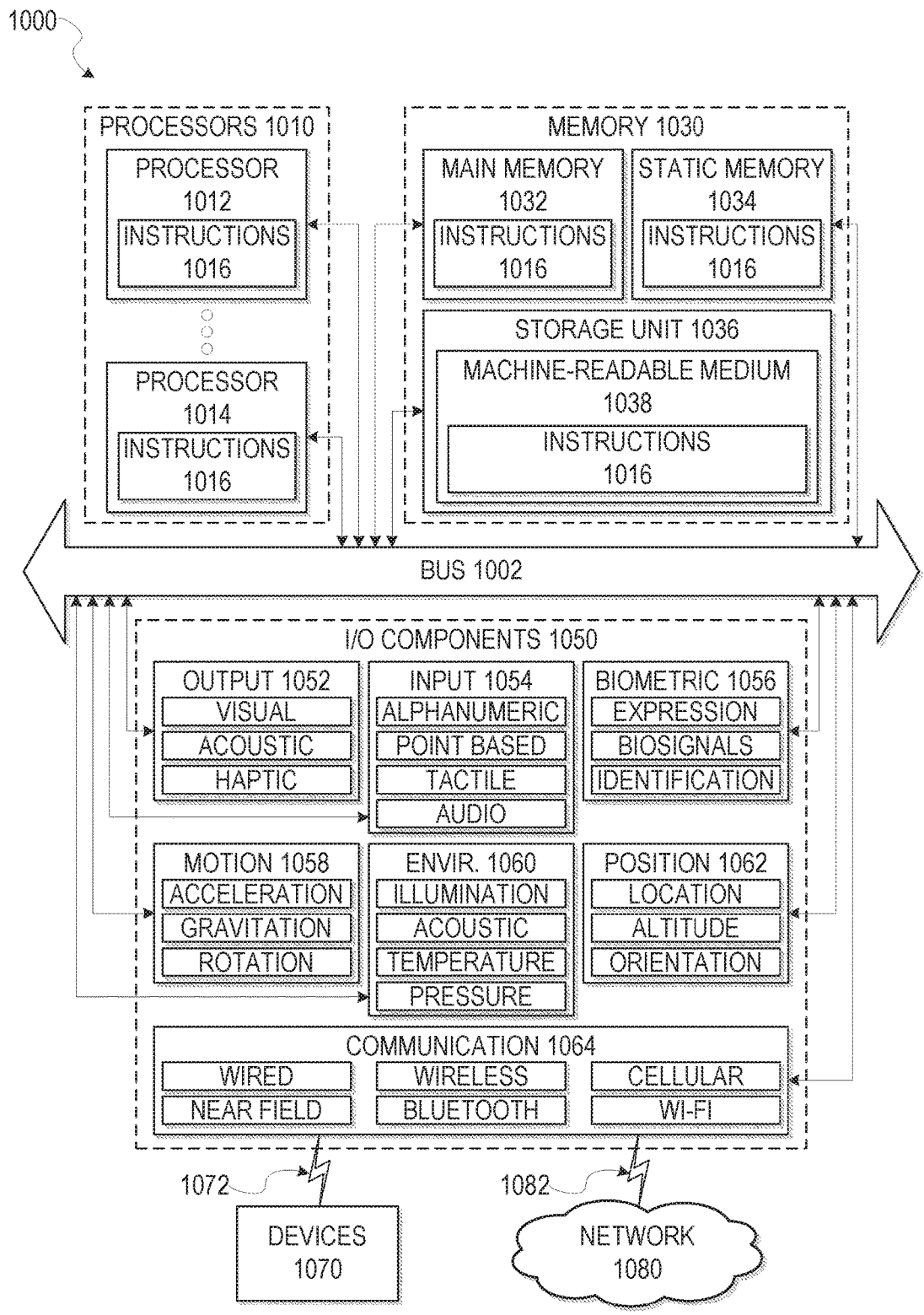
FIG. 11 is a diagrammatic representation of a machine in the form of a computer system within which a set of instructions may be executed for causing the machine to perform any one or more of the methodologies discussed herein, according to an example embodiment.

FIG. 10 is a block diagram illustrating an example of a software architecture that may be installed on a machine and used with aspects of functional reactive PCells according to some example embodiments. FIG. 10 includes system 1000 with software architecture 1002 that may be installed on a machine 1100 and used with aspects of a design flow such as design flow 110, including FR-PCell processing 111, or with any method, program, or computer readable instructions described herein. Elements or all of software architecture 1002 may be considered part of an electric design automation (EDA) environment operating on an EDA computing device or EDA machine 1100 (FIG. 11). In such an EDA environment, I/O components 1150 may present user interface elements as part of software architecture 1002 to enable a user to provide inputs, for example, as part of design input operation 111, PCell parameters operation 202, user edits 502, or other inputs made directly by designers. Additionally, in some embodiments an interface may be provided to "turn off" LRE operation in an EDA environment. Such an embodiment may maintain a reactive kernel operating within architecture 1002 that maintains PCell processing operations for individual PCells, but prevents communication between other PCells.

FIG. 10 shows is a block diagram illustrating a software architecture 1002, which can be used as an electronic design automation computing device to implement any of the methods described above. Aspects of software architecture 1002 may, in various embodiments, be used to store and execute functional reactive PCells and systems for managing PCells in an EDA environment to generate circuit designs, with physical devices generated using these circuit designs.

FIG. 10 is merely a non-limiting example of a software architecture 1002, and it will be appreciated that many other architectures can be implemented to facilitate the functionality described herein. In various embodiments, the software architecture 1002 is implemented by hardware such as machine 1100 of FIG. 11 that includes processors 1110, memory 1130, and I/O components 1150. In this example, the software architecture 1002 can be conceptualized as a stack of layers where each layer may provide a particular functionality. For example, the software architecture 1002 includes layers such as an operating system 1004, libraries 1006, frameworks 1009, and applications 1010. Operationally, the applications 1010 invoke application programming interface (API) calls 1012 through the software stack and receive messages 1014 in response to the API calls 1012, consistent with some embodiments. In various embodiments, any client device, server computer of a server system, or any other device described herein may operate using elements of software architecture 1002. An EDA computing device described herein may additionally be implemented using aspects of the software architecture 1002, with the architecture 1002 adapted for operating to use FR-PCells in any manner described herein.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of PCells for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like.

The software frameworks 1009 provide a high-level common infrastructure that can be utilized by the applications 1010, according to some embodiments. For example, the software frameworks 1009 provide various graphic user interface (GUI) functions, high-level resource management, high-level location services, and so forth. The software frameworks 1009 can provide a broad spectrum of other APIs that can be utilized by the applications 1010, some of which may be specific to a particular operating system or platform.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a Field-Programmable Gate Array (FPGA) or an Application Specific Integrated Circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine, but deployed across a number of machines. In some example embodiments, the processors or processor-implemented modules are located in a single geographic location (e.g., within a home environment, an office environment, or a server farm). In other example embodiments, the processors or processor-implemented modules are distributed across a number of geographic locations.

FIG. 11 is a diagrammatic representation of the machine 1100 in the form of a computer system within which a set of instructions may be executed for causing the machine 1100 to perform any one or more of the methodologies discussed herein, according to an example embodiment. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, a set-top box (STB), a personal digital assistant (PDA), an entertainment media system, a cellular telephone, a smart phone, a mobile device, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In an example embodiment, the processors 1110 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) include, for example, a processor 1112 and a processor 1114 that may execute the instructions 1116. The term "processor" is intended to include multi-core processors that may comprise two or more independent processors (also referred to as "cores") that can execute instructions 1116 contemporaneously. Although FIG. 11 shows multiple processors 1110, the machine 1100 may include a single processor with a single core, a single processor with multiple cores (e.g., a multi-core processor), multiple processors with a single core, multiple processors with multiples cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown in an example embodiment to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., instructions 1116) for execution by a machine (e.g., machine 1100), such that the instructions, when executed by one or more processors of the machine 1100 (e.g., processors 1110), cause the machine 1100 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., Erasable Programmable Read-Only Memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various example embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some further example embodiments, the I/O components 1150 include biometric components 1156, motion components 1158, environmental components 1160, or position components 1162, among a wide array of other components Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, communication components 1164 include wired communication components, wireless communication components, cellular communication components, Near Field Communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a Universal Serial Bus (USB)).

Transmission Medium

In various example embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling. In this example, the coupling 1082 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long Term Evolution (LTE) standard, others defined by various standard-setting organizations, other long range protocols, or other data transfer technology.

Furthermore, the machine-readable medium 1038 is non-transitory (in other words, not having any transitory signals) in that it does not embody a propagating signal. However, labeling the machine-readable medium 1038 "non-transitory" should not be construed to mean that the medium 1038 is incapable of movement; the medium 1038 should be considered as being transportable from one physical location to another. Additionally, since the machine-readable medium 1038 is tangible, the medium 1038 may be considered to be a machine-readable device.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. An electric design automation (EDA) computing device comprising:
    a memory, and
    one or more hardware processors coupled to the memory and configured to:
        initiate a processor evaluation of a first parameterized cell comprising data stored in the memory to generate a first instance of the first parameterized cell, the first parameterized cell comprising one or more reactive parameters and the first parameterized cell being part of a circuit design dataset;
        access one or more static cell parameters for the first parameterized cell from a memory of the EDA computing device;
    identify a first reactive parameter of the one or more reactive parameters and a first evaluation state associated with the first reactive parameter;
        determine a first value of the first reactive parameter, wherein the first value of the first reactive parameter is determined, at least in part, in conjunction with one or more context elements of the circuit design dataset having a first set of context values, and wherein the one or more context elements are identified by the one or more hardware processors as part of the processor evaluation of the first parameterized cell; and
        generate the first parameterized cell using the one or more static cell parameters and the first value of the first reactive parameter, the first instance of the first parameterized cell.

2. The device of claim 1 wherein the one or more processors are further configured to:
    communicate a notification of the first value of the first reactive parameter to a second processor evaluation of a second parameterized cell using a mailbox process, wherein the mailbox process is managed by a live reaction engine executed by the one or more processors.

3. The device of claim 1, wherein the determination of the first value of the first reactive parameter as determined in conjunction with the one or more context elements of the circuit design dataset having the first set of context values comprises determining the first value of the first reactive parameter using one or more metal layers of the circuit design dataset.

4. The device of claim 1, wherein the determination of the first value of the first reactive parameter as determined in conjunction with the one or more context elements of the circuit design dataset having the first set of context values comprises determining one or more guard ring cuts for the circuit design dataset.

5. The device of claim 1, wherein the determination of the first value of the first reactive parameter as determined in conjunction with the one or more context elements of the circuit design dataset having the first set of context values comprises determining the first value of the first reactive parameter using one or more interconnects of the circuit design dataset.

6. The device of claim 1, wherein the determination of the first value of the first reactive parameter as determined in conjunction with the one or more context elements of the circuit design dataset having the first set of context values comprises determining the first value of the first reactive parameter using routing and via creation information.

7. The device of claim 1, wherein the one or more hardware processors are further configured to:
pause the evaluation of the first parameterized cell as part of a pause and look around operation following the identification of the first reactive parameter and prior to the determination of the first value of the first reactive parameter;
initiate evaluation of a second parameterized cell as part of the pause and look around operation in response to determining that the one or more context elements comprises the second parameterized cell; and
resuming the evaluation of the first parameterized cell following the evaluation of the second parameterized cell,
wherein the determination of the first value of the first reactive parameter as determined in conjunction with context elements of the one or more context elements from the evaluation of the second parameterized cell.

8. The device of claim 1, wherein the one or more hardware processors are further configured to:
store an intermediate configuration of the first parameterized cell as part of the pause and look around operation;
identify a design change associated with the one or more context elements following determination of the first reactive parameter; and
performing an update using the intermediate configuration of the parameterized cell and the design change.

9. A method performed by an electronic design automation (EDA) computing device comprising one or more processors and a memory coupled to the one or more processors, the method comprising:
receiving a user input to adjust a first portion of a layout to generate an initial functional reactive parameterized cell (FR-PCell) layout, the initial FR-PCell layout comprising a first parameterized cell;
in response to the user input, automatically initiating a processor evaluation of the first parameterized cell, the first parameterized cell comprising one or more reactive parameters and the first parameterized cell being part of a circuit design dataset;
identifying a first reactive parameter of the one or more reactive parameters at a first evaluation state as part of the processor evaluation;
determining a first value of the first reactive parameter at the first evaluation state, wherein the first value of the first reactive parameter is determined, at least in part, in conjunction with one or more context elements of the circuit design dataset having a first set of context values, and wherein the one or more context elements are identified by the one or more hardware processors as part of the processor evaluation of the first parameterized cell; and
generating a first layout state comprising a first instance of the first parameterized cell using the first value of the first reactive parameter.

10. The method of claim 9 wherein generation of the first layout state comprising the first instance of the first parameterized cell comprises:
determining the first value of the first reactive parameter of the one or more reactive parameters based on a change in the one or more context elements of the layout, wherein the change in the one or more context elements is initiated by the user input; and
modifying at least a portion of the one or more context elements of the layout based on generation of the first instance of the first parameterized cell to generate the first layout state.

11. The method of claim 10 further comprising:
updating an output display with a visual indication of changes to the layout state associated with the first value of the first reactive parameter; and
wherein the user input adjusting the first portion of a layout comprises a user input adjusting a first context element outside of the first instance of the first parameterized cell.

12. The method of claim 10 further comprising:
generating a list comprising the first value of the first reactive parameter and one or more modifications to the one or more context elements of the layout; and
updating an output display with the list,
wherein the user input comprises placement of the first parameterized cell within a graphical user interface of the EDA computing device.

13. A non-transitory computer readable medium comprising instructions that, when executed by one or more processors of a device, cause the device to perform operations comprising:
receiving a user input to adjust a first portion of a layout to generate an initial functional reactive parameterized cell (FR-PCell) layout, the initial FR-PCell layout comprising a first parameterized cell;
in response to the user input, automatically initiating a processor evaluation of the first parameterized cell, the first parameterized cell comprising one or more reactive parameters and the first parameterized cell being part of a circuit design dataset;
identifying a first reactive parameter of the one or more reactive parameters at a first evaluation state as part of the processor evaluation;
determining a first value of the first reactive parameter at the first evaluation state, wherein the first value of the first reactive parameter is determined, at least in part, in conjunction with one or more context elements of the circuit design dataset having a first set of context values, and wherein the one or more context elements are identified by the one or more hardware processors as part of the processor evaluation of the first parameterized cell; and
generating a first layout state comprising a first instance of the first parameterized cell using the first value of the first reactive parameter.

14. The non-transitory computer readable medium of claim 13, wherein the instructions further cause the device to perform operations comprising:
determining the first value of the first reactive parameter of the one or more reactive parameters based on a change in the one or more context elements of the layout, wherein the change in the one or more context elements is initiated by the user input; and modifying at least a portion of the one or more context elements of the layout based on generation of the first instance of the first parameterized cell to generate the first layout state.

15. The non-transitory computer readable medium of claim 13, wherein the instructions further cause the device to perform operations comprising:

updating an output display with a visual indication of changes to the layout state associated with the first value of the first reactive parameter, wherein the user input adjusting the first portion of a layout comprises a user input adjusting a first context element outside of the first instance of the first parameterized cell.

16. The non-transitory computer readable medium of claim 15, wherein the instructions further cause the device to perform operations comprising:

generating a list comprising the first value of the first reactive parameter and one or more modifications to the one or more context elements of the layout; and updating an output display with the list, wherein the user input comprises placement of the first parameterized cell within a graphical user interface of the EDA computing device.

17. The non-transitory computer readable medium of claim 13, wherein the determination of the first value of the first reactive parameter as determined in conjunction with the one or more context elements of the circuit design dataset having the first set of context values comprises determining the first value of the first reactive parameter using one or more metal layers of the circuit design dataset.

18. The non-transitory computer readable medium of claim 13, wherein the determination of the first value of the first reactive parameter as determined in conjunction with the one or more context elements of the circuit design dataset having the first set of context values comprises determining one or more guard ring cuts for the circuit design dataset.

19. The non-transitory computer readable medium of claim 13, wherein the determination of the first value of the first reactive parameter as determined in conjunction with the one or more context elements of the circuit design dataset having the first set of context values comprises determining the first value of the first reactive parameter using one or more interconnects of the circuit design dataset.

20. The non-transitory computer readable medium of claim 13 wherein the instructions further cause the device to perform operations comprising:

pause the evaluation of the first parameterized cell as part of a pause and look around operation following the identification of the first reactive parameter and prior to the determination of the first value of the first reactive parameter;

initiate evaluation of a second parameterized cell as part of the pause and look around operation in response to determining that the one or more context elements comprises the second parameterized cell; and resuming the evaluation of the first parameterized cell following the evaluation of the second parameterized cell, wherein the determination of the first value of the first reactive parameter as determined in conjunction with context elements of the one or more context elements from the evaluation of the second parameterized cell.

* * * * *